United States Patent [19]

Kimura et al.

[11] Patent Number: 5,051,911
[45] Date of Patent: Sep. 24, 1991

[54] APPARATUS FOR EFFECTING SIMULATION OF A LOGIC CIRCUIT AND METHOD FOR PRODUCING A SEMICONDUCTOR DEVICE USING THE SIMULATION APPROACH

[75] Inventors: Masaharu Kimura, Kawasaki; Yoshihiro Tada, Yokohama, both of Japan

[73] Assignee: Fujitsu Limited, Kawasaki, Japan

[21] Appl. No.: 441,944

[22] Filed: Nov. 27, 1989

[30] Foreign Application Priority Data

Nov. 25, 1988 [JP] Japan .............................. 63-298915

[51] Int. Cl.$^5$ ............................................ G06F 11/22
[52] U.S. Cl. ................................... 364/468; 364/489; 364/490; 364/578
[58] Field of Search ................ 364/468, 488, 489, 490, 364/491, 578, 200, 900; 371/23; 307/590-592

[56] References Cited

U.S. PATENT DOCUMENTS

| | | | |
|---|---|---|---|
| 4,715,035 | 12/1987 | Boehner | 371/23 |
| 4,763,289 | 8/1988 | Barzilai et al. | 364/578 |
| 4,907,180 | 3/1990 | Smith | 364/578 |
| 4,922,445 | 5/1990 | Mizoue et al. | 364/578 |
| 4,937,770 | 6/1990 | Samuels et al. | 364/578 |
| 4,940,908 | 7/1990 | Tran | 307/443 |

Primary Examiner—Jerry Smith
Assistant Examiner—Paul Gordon
Attorney, Agent, or Firm—Staas & Halsey

[57] ABSTRACT

An apparatus for effecting a logic circuit simulation based on logic circuit information concerning the logic circuit and input signal information concerning each of circuit elements constituting the logic circuit according to simulation control information and producing output signal information, and a method for producing a semiconductor device using the simulation approach. By determining an input side signal delay value and an output side signal delay value with respect to a circuit element which is a simulation object, comparing the determined delay values and, based on a result of the comparing, determining an output signal value of the simulation object circuit element, it is possible to effect a perfect simulation on a transistor level subordinate to a gate level in practical processing time without using a special computer.

31 Claims, 22 Drawing Sheets

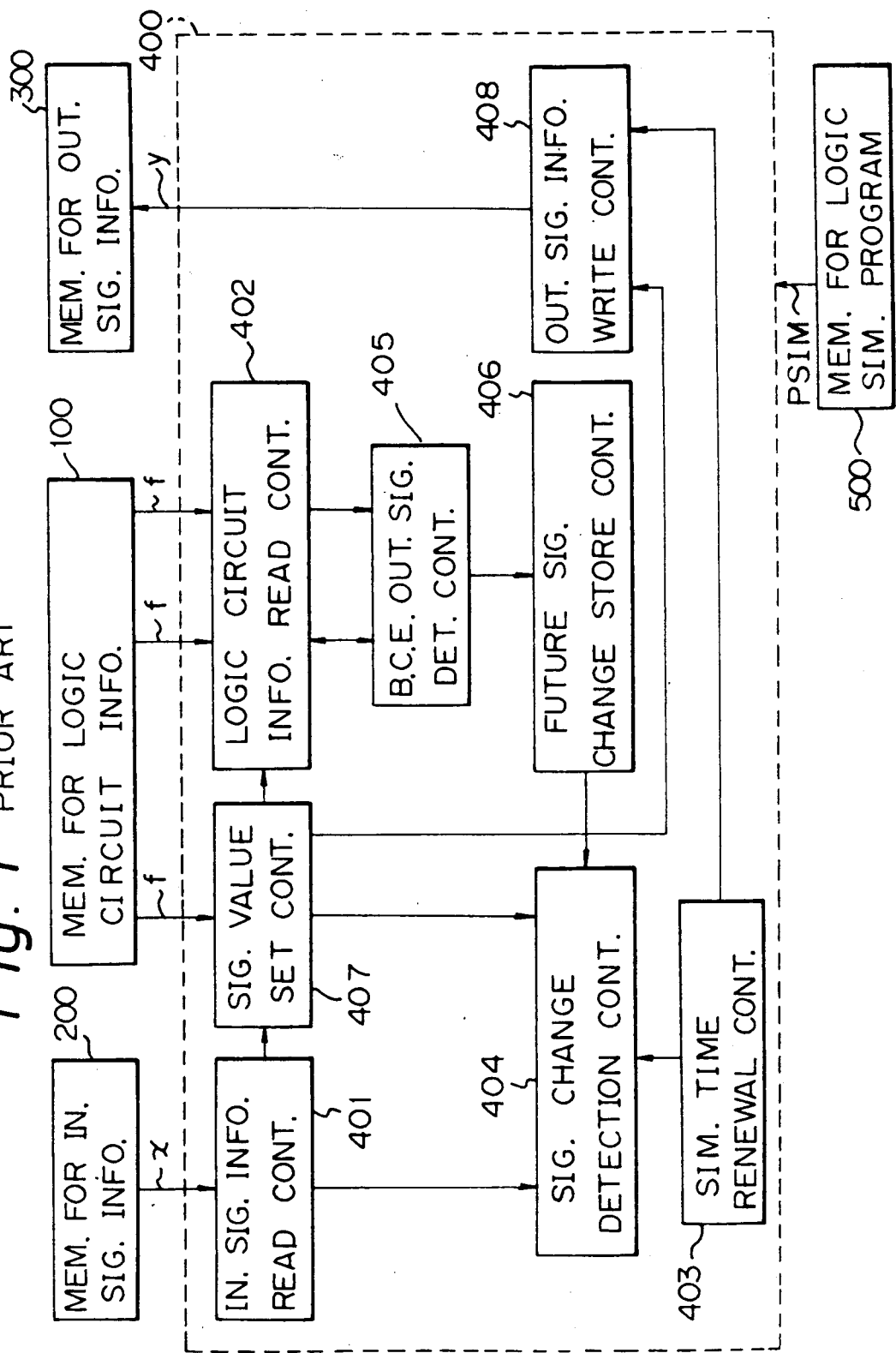

| SIG. NAME | SIG. CHANGE TIME | SIG. VALUE |
|---|---|---|

| N1 | 0 | 0 |
|---|---|---|
| N1 | 2 | 1 |
| N1 | 5 | 0 |

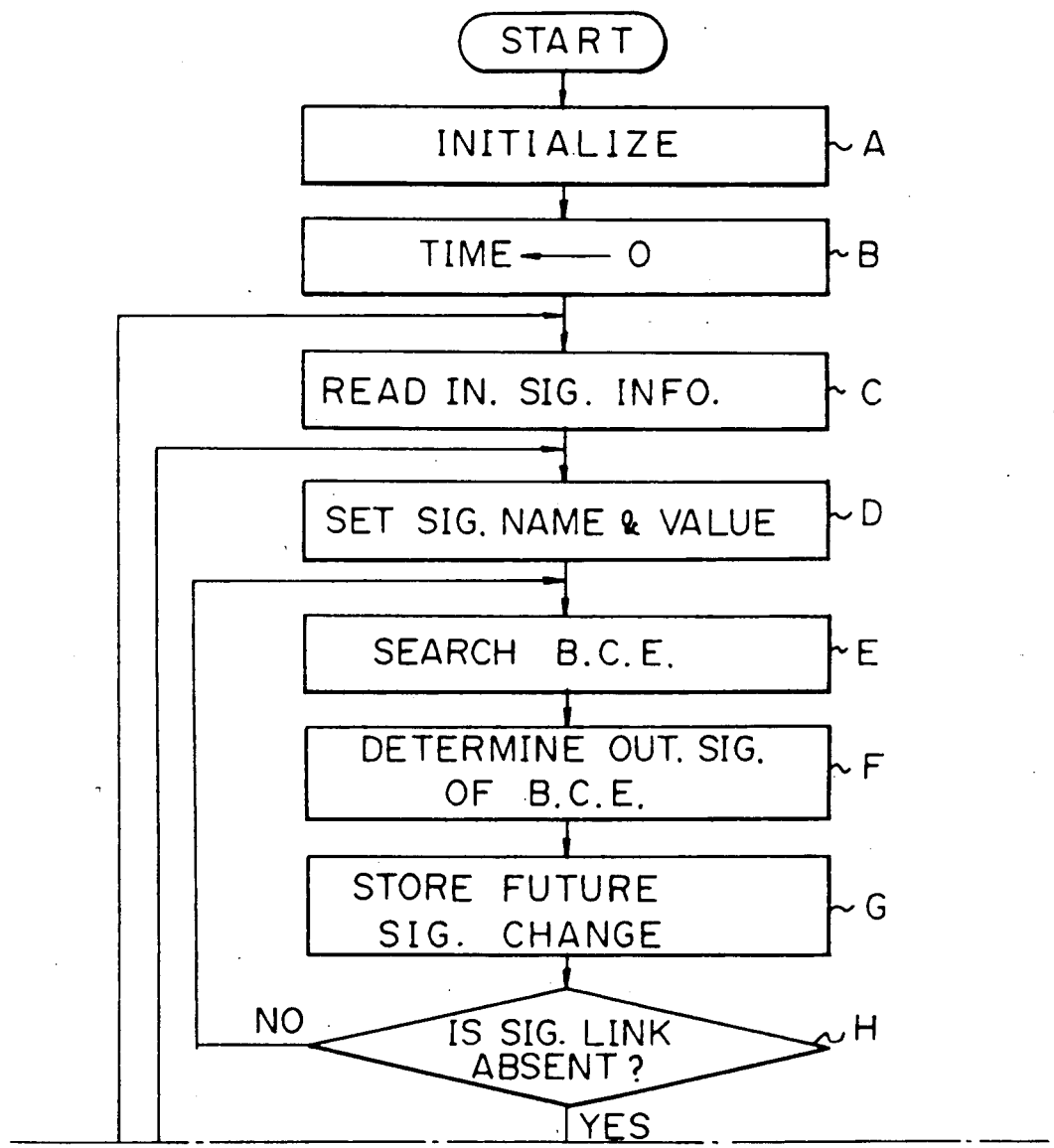

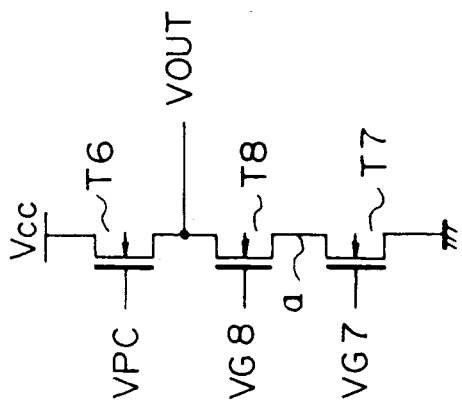
Fig. 7A
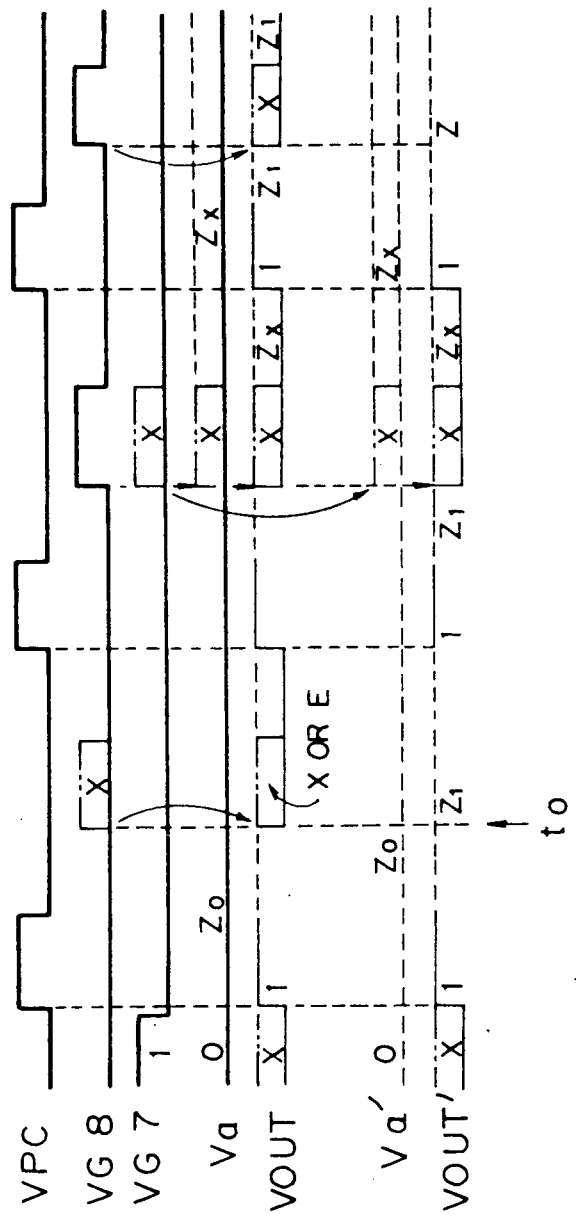
Fig. 7B
Fig. 7C

Fig. 8A
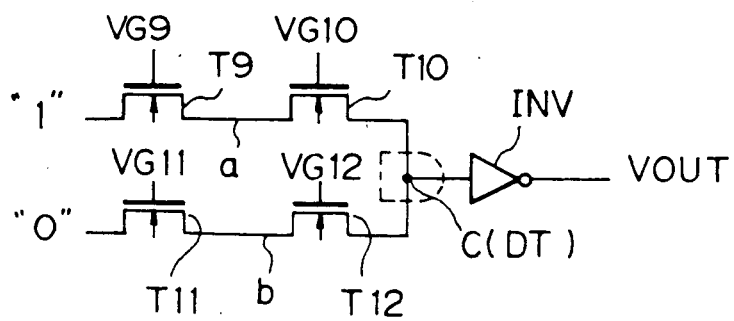
Fig. 8B
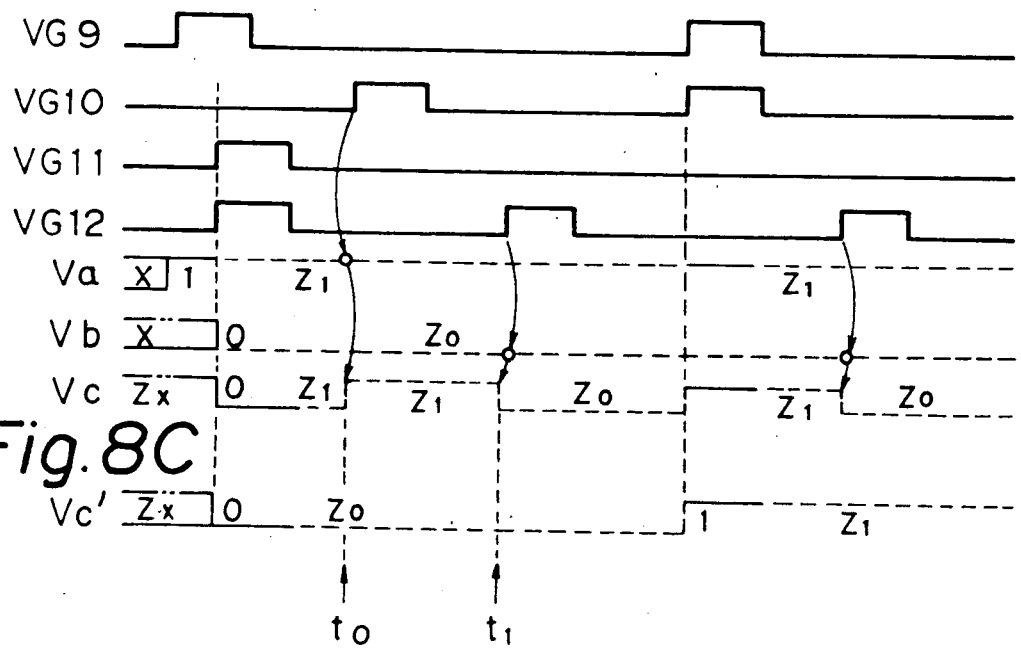
Fig. 8C

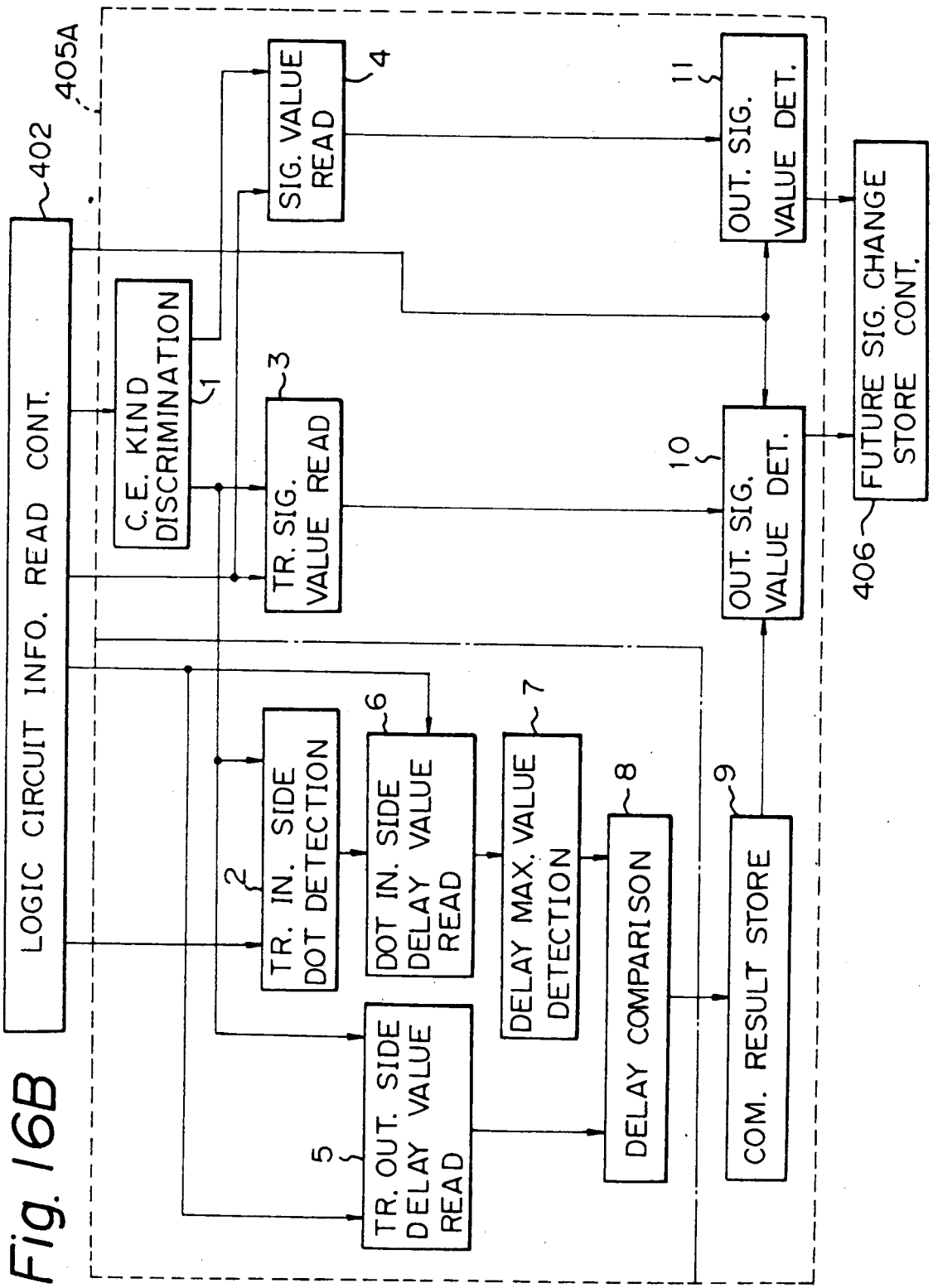

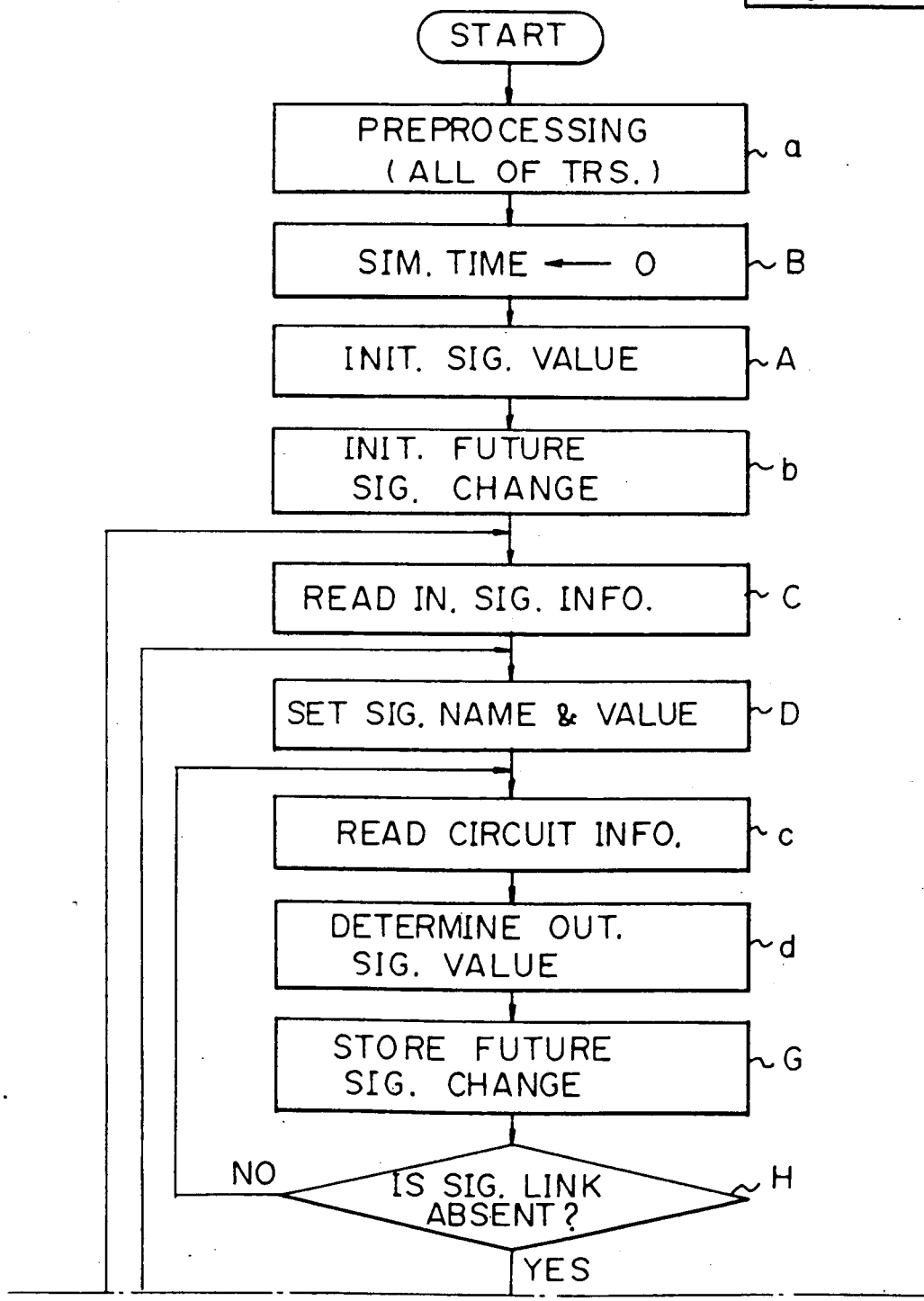

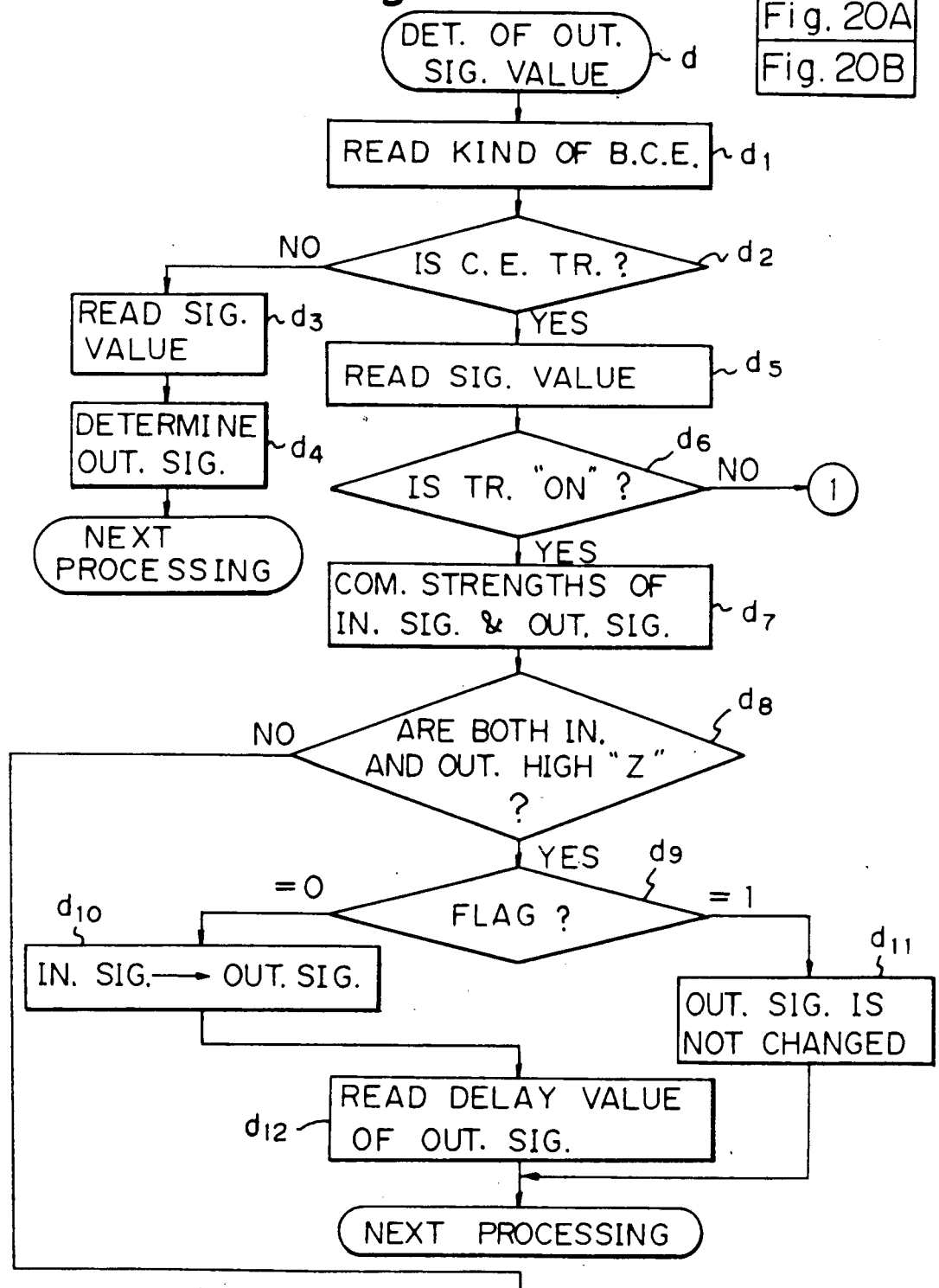

APPARATUS FOR EFFECTING SIMULATION OF A LOGIC CIRCUIT AND METHOD FOR PRODUCING A SEMICONDUCTOR DEVICE USING THE SIMULATION APPROACH

BACKGROUND OF THE INVENTION

1. Field of the Invention

The present invention relates to a technique of effecting simulation of a logic circuit. More particularly, it relates to an apparatus for effecting the simulation (hereinafter referred to as a logic circuit simulator) and a method for producing a semiconductor device using the logic simulation approach.

2. Description of the Related Art

A process of a logic design of a semiconductor LSI requires a step of verifying a function of a designed logic circuit, prior to a step of effecting an actual patterning of the logic circuit on a wafer. The step of verifying the function is carried out by the above logic circuit simulator.

The logic circuit simulator carries out a simulation for a logic circuit model equivalent to an actual logic circuit based on information of the logic circuit concerned (hereinafter referred to as logic circuit information) and input signal information, and outputs output signal information as a result of the simulation. The designed logic circuit concerned is estimated based on the output signal information.

The logic circuit simulator is broadly classified into two forms, i.e., the case that the simulation is carried out by software processing by means of a computer based on a simulation program and the case that the simulation is carried out by a simulator engine constituted by a dedicated hardware. In any case, logic circuit information able to be treated by the logic circuit simulator is on a level of a basic logic circuit element (gate level). As described later in detail, a technique has not been found heretofore in which a logic operation can be perfectly simulated on a transistor level subordinate to the gate level.

On the other hand, an apparatus has recently been developed which effects a simulation on a transistor level by treating a transistor as a switching element. However, this apparatus has problems in that processing speed is low and a large-scale hardware is needed.

SUMMARY OF THE INVENTION

An object of the present invention is to provide an apparatus capable of effecting a perfect simulation on a transistor level subordinate to a gate level in practical processing time without using a special computer.

Another object of the present invention is to provide a method for producing a semiconductor device by means of the transistor level simulation.

According to one aspect of the present invention, there is provided an apparatus for effecting a simulation of a logic circuit, the apparatus including: a unit for storing logic circuit information concerning the logic circuit, input signal information concerning each of circuit elements constituting the logic circuit, simulation control information and output signal information; and a controller for executing a logic circuit simulation based on the logic circuit information and the input signal information according to the simulation control information and producing the output signal information, the controller determining an input side signal delay value and an output side signal delay value with respect to a circuit element which is a simulation object, comparing the determined delay values and, based on a result of the comparing, determining an output signal value of the simulation object circuit element to form the output signal information.

Also, according to another aspect of the present invention, there is provided a method for producing a semiconductor device using a logic simulation approach, the method including the steps of: determining an input side signal delay value and an output side signal delay value with respect to each of circuit elements constituting a designed logic circuit which is a simulation object; comparing the determined input side signal delay value with the determined output side signal delay value; determining an output signal value of the simulation object circuit element based on a result of the comparing and then verifying a function of the designed logic circuit; and effecting a patterning of the designed logic circuit on a semiconductor wafer to produce a semiconductor device.

BRIEF DESCRIPTION OF THE DRAWINGS

Other objects and features of the present invention will be described hereinafter in detail by way of preferred embodiments with reference to the accompanying drawings, in which:

FIG. 1 is a block diagram illustrating a constitution of a prior art logic circuit simulator;

FIGS. 4A and 4B are flow charts representing an operation of the logic circuit simulator shown in FIG. 1;

FIG. 7A is a circuit diagram of a third logic circuit;

FIGS. 7B and 7C are timing charts representing operations of the logic circuit shown in FIG. 7A;

FIG. 8A is a circuit diagram of a fourth logic circuit;

FIGS. 8B and 8C are timing charts representing operations of the logic circuit shown in FIG. 8A;

FIGS. 16A and 16B are block diagrams illustrating a constitution of the logic circuit simulator as an embodiment of the present invention;

FIGS. 20A and 20B are flow charts representing a part of the processing (d) of determining output signal values in FIG. 18A.

DESCRIPTION OF THE PREFERRED EMBODIMENTS

Figure 2A:
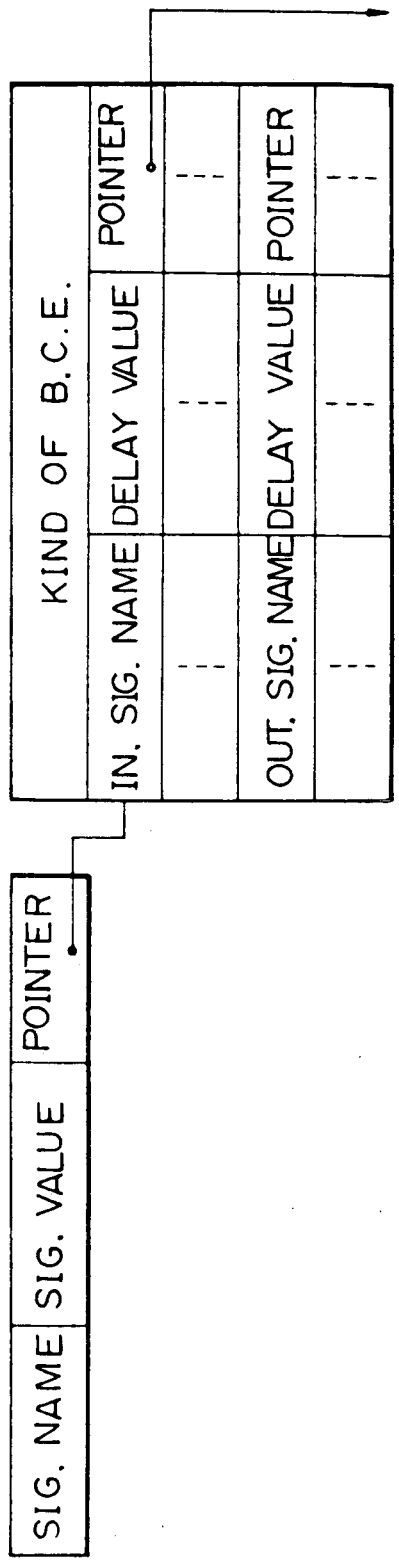
FIGS. 2A to 2C are explanatory diagrams of logic circuit information (f)

For a better understanding of the preferred embodiment of the present invention, the problems of the prior art will be explained with reference to FIGS..1 to 8C.

FIG. 1 illustrates a constitution of a prior art logic circuit simulator. Note, the illustrated simulator shows an example embodied by software processing by means of a computer based on a simulation program.

As shown in FIG. 1, the logic circuit simulator is constituted by a memory 100 for storing logic circuit information (f), a memory 200 for storing input signal information (x), a memory 300 for storing output signal information (y), a memory 500 for storing logic simulation program (PSIM), and a controller 400 for executing a simulation based on the input signal information (x) and the logic circuit information (f) according to the logic simulation program (PSIM) and outputting the output signal information (y).

Figure 2C:
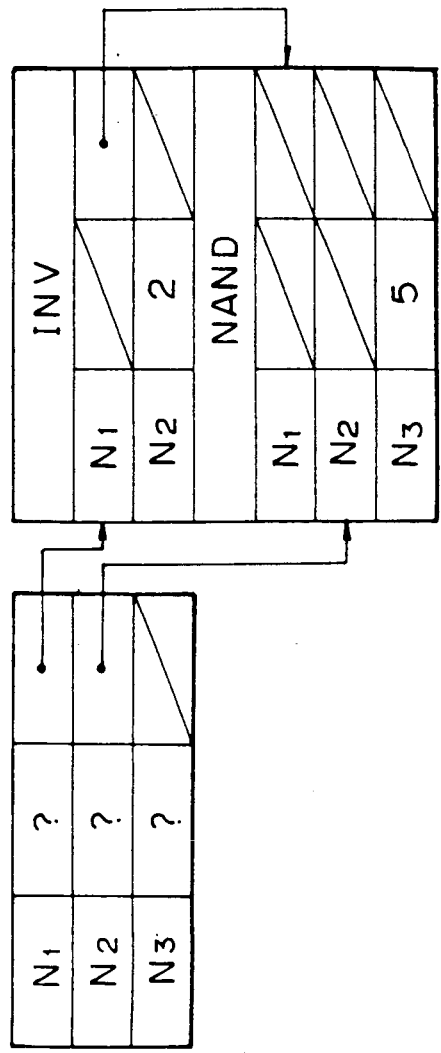
Figure 2B:
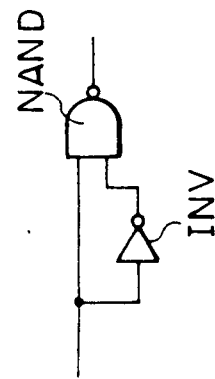

Referring to FIGS. 2A to 2C, the logic circuit information (f) includes information of "a kind of a basic circuit element" constituting the logic circuit concerned, "an input signal name", "an output signal name", "a delay value of the output signal", and the like. For example, where the logic circuit is the constitution shown in FIG. 2B, the basic circuit element is defined by an inverter INV and a not-and(NAND) gate. Also, as shown in FIG. 2C, the input signal name such as "N1,N2,N3", the delay value of the output signal such as "2, 5", and the like are put in order on the table, and pointers are allocated to each data.

Figures 3A, 3B, 3C:
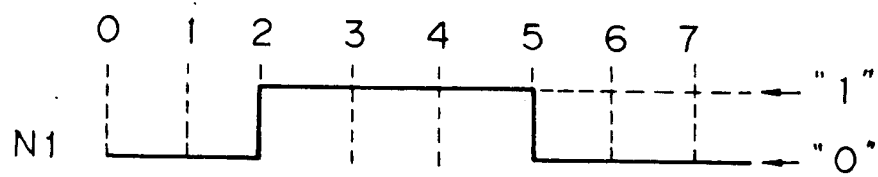
FIGS. 3A to 3C are explanatory diagrams of input signal information (x)

Also, referring to FIGS. 3A to 3C, the input signal information (x) includes information of "an input signal name", "a signal change time", "an input signal value", and the like. For example, assuming that the input signal has the form (N1) shown in FIG. 3B, each data is put in order on the table in the manner shown in FIG. 3C. Namely, when the signal change times are 0, 2 and 5, the input signal values are 0, 1 and 0, respectively.

Although the forms of the output signal information are not shown, the output signal information (y) includes information of "an output signal name", "a signal change time", "an output signal value", and the like. Each data is put in order on the table in the manner similar to that in FIG. 3C.

The simulation execution controller 400 is an information processing apparatus employing stored program method and normally embodied by a computer. This simulation execution controller 400 estimates the performance of the logic circuit model according to the logic simulation program (PSIM). The logic simulation program (PSIM) is comprised of a sequence of procedures for estimating the performance of the logic circuit model. As programming language, simulation language is suitable because the simulation treats complex events. The functions that the simulation execution controller 400 carries out according to the logic simulation program (PSIM) are shown in the form of block diagram in FIG. 1.

Namely, the simulation execution controller 400 is constituted by a control unit 401 for reading the input signal information (x) from the input signal information memory 200, a control unit 402 for reading the logic circuit information (f) from the logic circuit information memory 100, a simulation time renewal control unit 403 for running the logic simulation program (PSIM) at equal time intervals (simulation time), a control unit 404 for detecting a signal change, a control unit 405 for determining the output signal of a basic circuit element, a control unit 406 for storing time of a future change of the output signal, a control unit 407 for setting the output signal value, and a control unit 408 for writing the set output signal value into the output signal information memory 300.

Next, the operation of the above explained logic circuit simulator will be explained. Note, prior to the execution of the simulation, the logic circuit information (f) and the input signal information (x) are produced in advance and stored in the memories 100 and 200 according to the manners shown in FIGS. 2C and 3C, respectively.

Figure 4B:
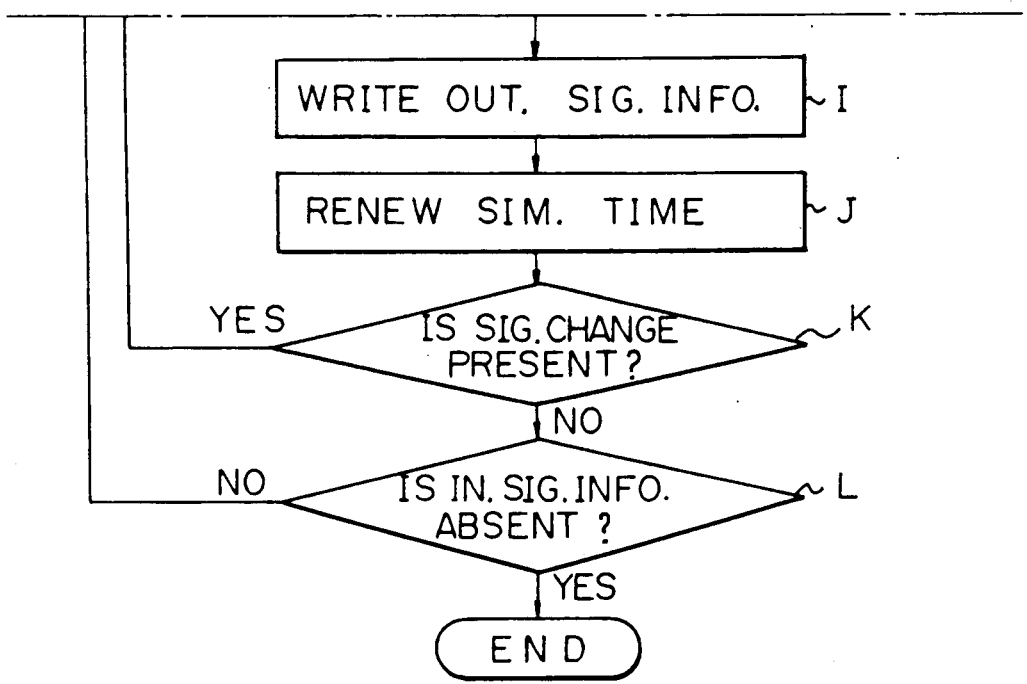

FIGS. 4A and 4B illustrate flow charts of the operation of the logic circuit simulator shown in FIG. 1. The logic circuit simulator carries out simulation processing described below according to the logic simulation program (PSIM).

At steps (A) and (B), the control initializes a signal value of the logic circuit information (f), a content of the output signal information (y), simulation time in the logic simulation program (PSIM), and the like.

At step (C), the control reads a set of a signal name bringing about a signal change, the signal change time and signal value from the input signal information (x).

At steps (D) and (E), the control searches a signal name corresponding to the logic circuit information (f) from the read signal name and specifies the corresponding signal value. Then, the control traces the corresponding pointer to search basic circuit elements having the same signal name as the searched signal name.

At step (F), after specifying the kind of the searched basic circuit element, the control determines an output signal value from the input signal value of the element concerned according to the logic operation of the element. Then, at step (G), the control stores a signal value of the corresponding signal name as a signal change after "current time plus delay time", i.e., future signal change. Next, at step (H), the control judges whether the signal link is absent (YES) or not (NO), and proceeds to step (I) if the result is YES. If the result is NO, the control returns to step (E), and repeats the processings of steps (E) to (G) by tracing the pointers until the basic circuit elements having the same signal name as the searched signal name are gone.

At step (I), the control writes the signal value of the logic circuit information (f) at the current simulation time into the memory 300 as the output signal information (y).

At step (J), the control renews the current simulation time to form a new simulation time. Then, at step (K), the control judges whether the signal change is present (YES) or not (NO), and proceeds to step (L) if the result is NO. If the result is YES, the control returns to step (D). Namely, where information which brings about a signal change at the new simulation time among the signal changes at steps (B) or (F,G,H) is present, the control repeats the processings of steps (D) to (J).

Finally, at step (L), the control judges whether the input signal information is absent (YES) or not (NO), and proceeds to an END if the result is YES. If the result is NO, the control returns to step (C), and repeats the processings of steps (C) to (K) until the input signal information is gone.

As explained above, it is possible to simulate an arbitrary logic circuit by determining the operation of basic circuit elements. However, the simulation becomes possible only in the case that the basic circuit elements are treated on the gate level. Where the simulation is carried out on the transistor level, the operation of the transistor has been conventionally defined as follows:

(1) When a gate signal value of a MOS transistor becomes active, an input signal value of the transistor is treated as an output signal value thereof.

Note, the expression that the gate signal value becomes active indicates that the gate signal value is logic "0" where the transistor is a PMOS transistor, and that the gate signal value is logic "1" where the transistor is an NMOS transistor. Namely, it means a signal state which contributes to "ON" operation of the transistor.

(2) When the gate signal value of the MOS transistor becomes inactive, the output signal of the transistor is treated as a signal of high impedance (high "Z") state.

Thus, the operation of the transistor has been conventionally defined on the basis of whether the gate signal value is active or inactive.

By the way, each signal value treated by the logic circuit simulator is expressed by a combination of "a signal strength" and "a logic value". Note, the signal strength is defined according to an internal impedance of a signal source. Namely, the signal strength becomes greater as the internal impedance becomes smaller, and a signal having a greater signal strength is superior to one having a smaller signal strength. The signal strength is represented by the following relation:

$$S > R > Z \quad (1)$$

Note, S, R and Z indicate "strong", "resistive" and "high impedance", respectively. On the other hand, the logic value is classified into four kinds, i.e., "0", "1", an indefinite value "X", and an error value "E".

Thus, the signal value is represented by the combination of the signal strength and logic value as follows:

$$S0, S1, SX, SE > R0, R1, RX, RE > Z0, Z1, ZX, ZE \quad (2)$$

According to the prior art in which the simulation is carried out under the above definition, it is difficult to perfectly simulate the operation of a transistor or transistors constituting a basic logic circuit on the gate level. Namely, since the operation of individual transistor is not perfectly defined, as described later in detail, it is impossible to carry out a perfect simulation on the transistor level.

Hereinafter, the problems in the prior art logic circuit simulator will be explained by way of actual logic circuits including transistors with reference to FIGS. 5A to 8C.

Figure 5A:
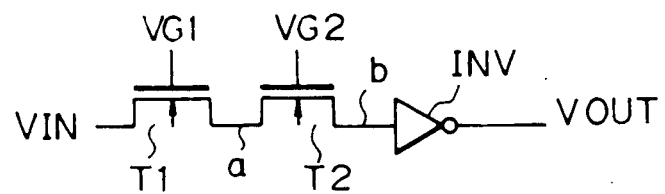
FIG. 5A is a circuit diagram of a first logic circuit.

FIG. 5A illustrates an example of a first logic circuit. The illustrated circuit is constituted by: an N-channel MOS (NMOS) transistor T1 which is responsive to a gate signal VG1 and transmits an input signal VIN to the output end (node a); an NMOS transistor T2 which is responsive to a gate signal VG2 and transmits a signal at node a to the output end (node b); and an inverter INV which is responsive to a signal at node b and generates an output signal VOUT.

Figure 5B:
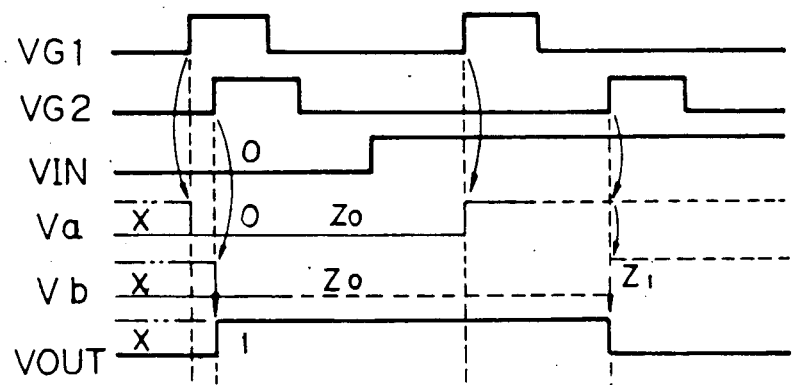
FIGS. 5B and 5C are timing charts representing operations of the logic circuit shown in FIG. 5A.
Figure 5C:
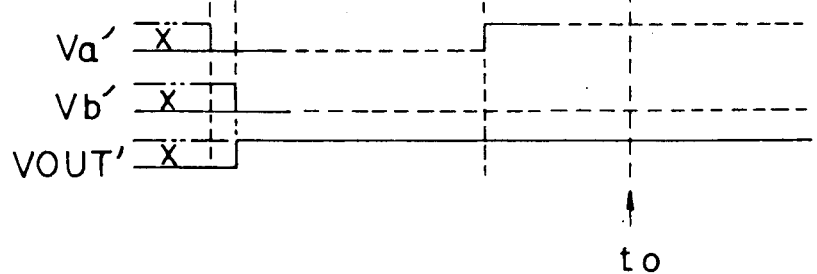

FIGS. 5B and 5C show timing charts representing the operations of the logic circuit of FIG. 5A. FIG. 5B represents an erroneous operation occurring in the prior art logic circuit simulator, while FIG. 5C represents a right operation which originally should be so. In FIGS. 5B and 5C, references Va,Va' and Vb,Vb' denote signals appearing at nodes a and b, respectively.

Referring to FIG. 5B, where the gate signals VG1 and VG2 are made "1" or "0" alternatively to turn ON or OFF the transistors T1,T2 alternately, a drawback occurs in that the input signal VIN is erroneously propagated to the output end to change the output signal VOUT at time $t_0$. Contrary to this, referring to FIG. 5C, the right operation must be in such a manner that, except when both the gate signal VG1 and the gate signal VG2 are made "1" at an identical timing, the output signal VOUT' is not changed (see time $t_0$) even if the input signal VIN is changed.

The cause for the above drawback is due to that the output signals of the transistors T1,T2 are maintained to the high impedance (Z) state at nodes a and b, respectively.

To cope with this, it is considered that a pair of transistors performing different operations are used as the transistors T1,T2, e.g., one is a transistor having a memory function and another is a transistor not having such a memory function. However, another problems occur in that works of selecting different kinds of transistors in the design of logic circuits are laborious, and that the preparation of two kinds of logics is troublesome from a viewpoint of the management.

Figure 6A:
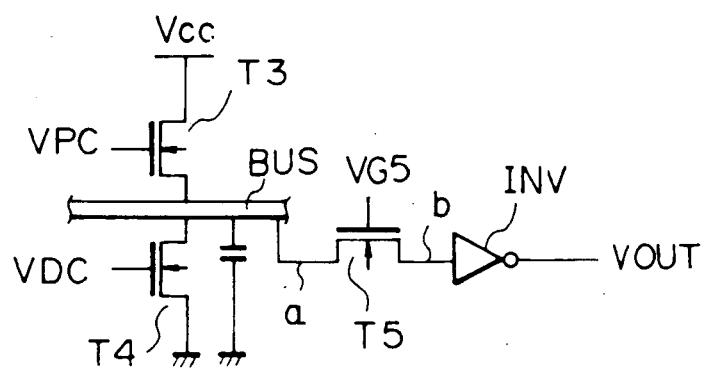
FIG. 6A is a circuit diagram of a second logic circuit.

FIG. 6A illustrates an example of a second logic circuit. The illustrated circuit is constituted by: an internal bus BUS; an NMOS transistor T3 which is responsive to a gate signal VPC and precharges the potential of the internal bus BUS to a level of Vcc; an NMOS transistor T4 which is responsive to a gate signal VDC and discharges the potential of the internal bus BUS to a ground level; an NMOS transistor T5 which is responsive to a gate signal VG5 and transmits a signal at the internal bus BUS (node a) to the output end (node b); and an inverter INV which is responsive to a signal at node b and generates an output signal VOUT.

Figure 6B:
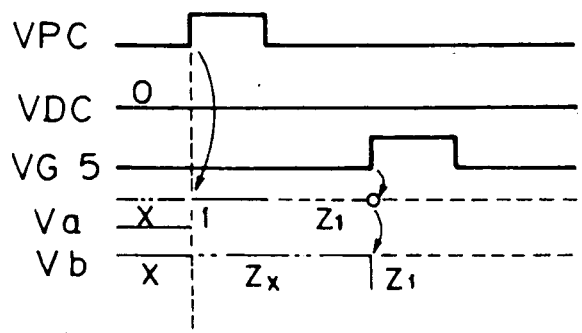
FIG. 6B is a timing chart representing an operation of the logic circuit shown in FIG. 6A.

FIG. 6B shows a timing chart representing the operation of the logic circuit of FIG. 6A, in which references Va and Vb denote signals appearing at nodes a and b, respectively.

In this case, the right operation must be in such a manner that, when the gate signal VG5 is changed to "1" level, the signal Va is changed in level and the signal Vb is then changed in level. Namely, the signal Va of high impedance state (Z1) at node a must be propagated to node b, inversely to the case of FIGS. 5A to 5C. If not so, it becomes impossible to rightly simulate the operation of the logic circuit of FIG. 6A.

FIG. 7A illustrates an example of a third logic circuit. The illustrated circuit is constituted by three NMOS transistors T6,T8 and T7 serially connected between the power supply line Vcc and the ground. The transistors T6,T8,T7 are responsive to gate signals VPC, VG8,VG7, respectively. An output signal VOUT is taken out from the connection point between the transistors T6 and T8.

FIGS. 7B and 7C show timing charts representing the operations of the logic circuit of FIG. 7A. FIG. 7B represents an erroneous operation, while FIG. 7C represents a right operation. In FIGS. 7B and 7C, references Va,Va' denote a signal appearing at the connection point between the transistors T8 and T7 (node a).

Referring to FIG. 7B, where the gate signal VG7 is made "0" to turn OFF the transistor T7, a possibility occurs in that, when an indefinite value signal "X" is applied to the transistor T8 as the gate signal VG8 at time $t_0$, the indefinite value signal "X" or the error value signal "E" is unconditionally output as the output signal VOUT. Contrary to this, referring to FIG. 7C, the right operation must be in such a manner that the output signal VOUT' is not changed (see time $t_0$) even if the gate signal VG8 is changed. Namely, it is preferable that the indefinite value signal "SX", "RX" or "ZX" corresponding to the input signal strength is output and the high impedance output signal is not changed in level. In the actual operation of logic circuits, a drawback frequently occurs in that, when an indefinite value signal "X" is applied to the transistor T8 as the gate signal VG8, the indefinite value signal which does not conform to the input signal strength is output.

FIG. 8A illustrates an example of a fourth logic circuit. The illustrated circuit is constituted by: an NMOS transistor T9 which is responsive to a gate signal VG9 and transmits a "1" level signal to the output end (node a); an NMOS transistor T10 which is responsive to a gate signal VG10 and transmits a signal at node a to the output end (node c); an NMOS transistor T11 which is responsive to a gate signal VG11 and transmits a "0" level signal to the output end (node b); an NMOS transistor T12 which is responsive to a gate signal VG12 and transmits a signal at node b to the output end (node c); and an inverter INV which is responsive to a signal at node c and generates an output signal VOUT.

Note, the portion shown by a broken line at node c denotes "a dot gate", which is formed by short-circuiting each output end of a plurality of logic circuits by means of a wired-OR connection.

FIGS. 8D and 8C show timing charts representing the operations of the logic circuit of FIG. 8A. FIG. 8B represents an erroneous operation, while FIG. 8C represents a right operation. In FIGS. 8B and 8C, references Va,Vb and Vc,Vc' denote signals appearing at nodes a,b and c, respectively.

Referring to FIG. 8B, where the gate signals VG10 and VG12 are made "1" or "0" alternately to turn ON or OFF the transistors T10,T12 alternately, a drawback occurs in that the signal Vc at node c is changed in level at times $t_0$ and $t_1$. Contrary to this, referring to FIG. 8C, the right operation must be in such a manner that the signal Vc' is not changed in level except when both the gate signal VG9 and the gate signal VG10 are made "1" at an identical timing or except when both the gate signal VG11 and the gate signal VG12 are made "1" at an identical timing.

In the above prior art logic circuit simulator, the technique has been explained in which a logic simulation is imperfectly carried out on the transistor level. With relation to the technique, a so-called switch level simulation apparatus has recently been developed which can effect a perfect simulation on the transistor level by treating a transistor as a switching element. The switch level simulation apparatus is excellent in accuracy.

However, the switch level simulation apparatus has disadvantages in that the algorithm of the simulation program is complicated, and that, when it carries out a floating point multiplication or division, its processing speed becomes low compared with a conventional gate level simulation apparatus. Accordingly, it is difficult to be applied to a relatively small-scale and general-purpose machine other than a high speed machine such as a large-scale computer.

Next, the preferred embodiment of the present invention will be explained in detail with reference to FIGS. 9 to 21.

Figure 9:
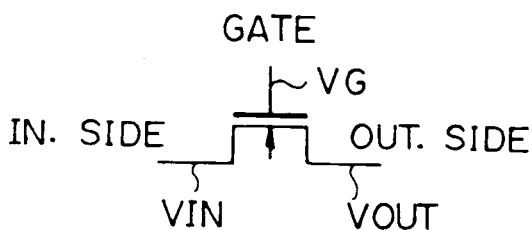
FIG. 9 is an explanatory diagram of a transistor which is an object to be simulated.

FIG. 9 illustrates a transistor (NMOS transistor) which is an object to be simulated (hereinafter referred to as an object transistor).

((Summary))

First, important points in the present embodiment will be summarized as follows:

[1] Definition of the basic operation of the object transistor

When the object transistor as the circuit element is turned ON, it outputs the output signal having a signal strength equal to or less than that of the input signal at the output side. Note, the signal strength obtained at the output side is equal to or less than the designated output signal strength. Namely, any signal having a signal strength more than the designated output signal strength is not obtained at the output side.

Accordingly, when the output signal strength of the object transistor is designated to be "strong", the basic operation of the object transistor is defined as follows:

(in. sig. strength)→(out. sig. strength)

S0, S1, SX, SE→S0, S1, SX, SE

R0, R1, RX, RE→R0, R1, RX, RE

Z0, Z1, ZX, ZE→Z0, Z1, ZX, ZE

Namely, the output signal strength is equal to the input signal strength.

Also, when the output signal strength of the object transistor is designated to be "resistive", the basic operation thereof is defined as follows:

(in. sig. strength)→(out. sig. strength)

S0, S1, SX, SE→R0, R1, RX, RE

R0, R1, RX, RE→Z0, Z1, ZX, ZE

Z0, Z1, ZX, ZE→Z0, Z1, ZX, ZE

Namely, the output signal strength is equal to or less than the input signal strength.

When the object transistor is turned OFF, the output signal at its output side is maintained to the impedance state immediately before the transistor is turned OFF.

After the object transistor is turned OFF, the output signal is not changed even if the input signal is changed.

[2] Definition for the determination of the output signal value

When both the input signal and the output signal have the signal strength of high impedance and the object transistor is turned ON, the output signal value is determined as follows:

① Comparison between delay values of the signals (or circuits)

A delay value of a signal (or a circuit) at the input side of the object transistor (hereinafter referred to as an input side delay value) is indicated by reference $td_1$, while a delay value of a signal (or a circuit) at the output side thereof (hereinafter referred to as an output side delay value) is indicated by reference $td_2$. The comparison between the input side delay value $td_1$ and the output side delay value $td_2$ is carried out as follows:

$$td_1 - td_2 > 0 \text{ or } td_1 - td_2 \leq 0 \quad (3)$$

This comparison is carried out to determine the movement direction of the signal of the transistor based on the difference between the time lags of signal propagation at the input/output sides.

Determination of the output signal value and the criterion therefor

The output signal value is determined based on the result of the above comparison as follows:

When $td_1 > td_2$, the output signal value is substituted by the input signal value, i.e., the output signal is changed.

Contrary to this, when $td_1 \leq td_2$, the output signal is not changed.

Figure 10:
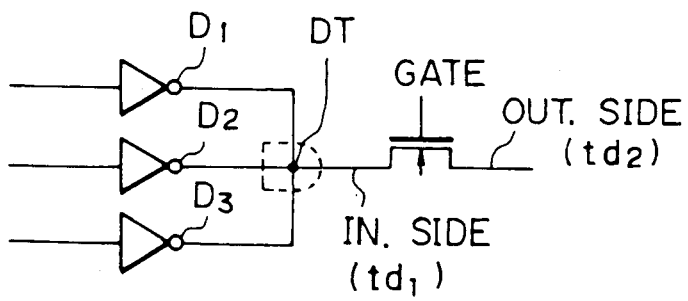
FIG. 10 is a circuit diagram illustrating a consititution at the input side of the object transistor.

As shown in FIG. 10, where the dot gate DT is present at the input side of the object transistor, the delay values of the signals at the input side of the dot gate are indicated by the input side delay value $td_1$. Note, in this case, the input side delay value $td_1$ is defined by an input signal having the greatest delay value among the plurality of input signals.

In the case of FIG. 10, the input side delay value $td_1$ of the object transistor is generally represented by the following equation:

$$td_1 = f(D1, D2, D3) \quad (4)$$

Note, D1, D2, D3 indicate an delay value of the output signal of each circuit (inverter) at the input side of the dot gate DT. As described above, since the input side delay value $td_1$ is defined by an input signal having the greatest delay value, it is represented as follows:

$$td_1 = \max.(D1, D2, D3) \quad (5)$$

The delay values $td_1, td_2$ are selected to be either a first value or a second value more than the first value. Note, the first and second values can be selected by a user of the logic circuit simulator.

Whether or not the processings described in [2] are applied to the logic simulation can be selected by a user of the logic circuit simulator.

[3] Treatment of the indefinite value and error value

Where the logic value of the gate signal of the object transistor is either an indefinite value "X" or an error value "E", a signal having the logic value "X" or "E" corresponding to the input signal strength is output as the output signal value of the transistor.

[4] Treatment of the case that the input signal value is equal to the output signal value Where the input signal value is equal to the output signal value, the output of the object transistor is not changed even if the logic value of the gate signal is the indefinite value "X" or error value "E". Note, the signal value is defined by the combination of the signal strength (S,R,Z) and the logic value (0,1,X,E), as expressed in the equation (2).

[5] Treatment of the signal of high impedance strength

Where all of the input signals of the dot gate DT are changed to the signals of high impedance strength, the output signal of the dot gate DT, i.e., the input signal of the object transistor, is maintained to the high impedance strength.

Note, where a signal name read from the input signal information is "a signal name of the dot gate", the processing described in [5] is not applied to the logic simulation.

Whether or not the condition described in is applied to the logic simulation can be arbitrarily selected by a user of the logic circuit simulator.

[6] Form of the delay values

Figure 11A:
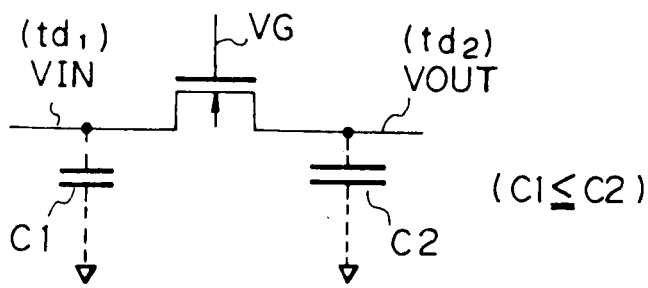
FIGS. 11A and 11B are explanatory diagrams of signal delay values at the input/output sides of the object transistor.
Figure 11B:
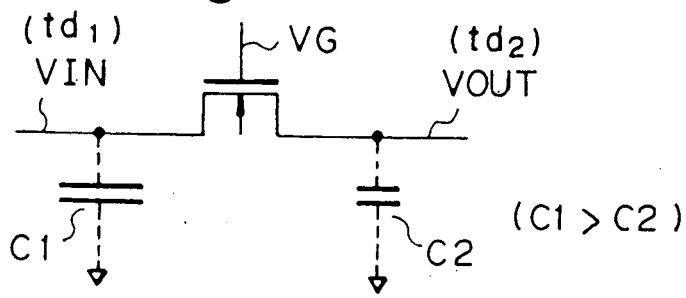

As shown in FIGS. 11A and 11B, the input side delay value $td_1$ and the output side delay value $td_2$ can be expressed by an equivalent capacitance value C1, C2 of a circuit element (not shown) connected to the input side and output side of the object transistor, respectively. Note, in the introduction, the capacitance values are not directly used, but the converted basic loading capacitance values are employed. The basic loading capacitance is a physical quantity expressed by the unit of "Lu (loading unit)", where 0.05 pF is equal to 1 Lu.

[7] Form of the object transistor(s)

Although, in the above description, the object transistor has been explained as the form of a threeterminal element shown in FIG. 9, the present invention is applicable to various transistors.

Some examples will be described below with reference to FIGS. 12 to 15D.

Figure 12:
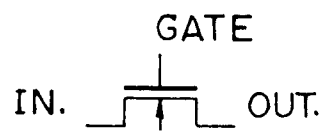
FIG. 12 is an explanatory diagram of a first object transistor (NMOS)

FIG. 12 illustrates a first example, which is an NMOS transistor (same as FIG. 9).

The transistor is brought to ON state when the logic value of the gate signal is "1", and the transistor is brought to OFF state when the logic value thereof is "0".

Figure 13:
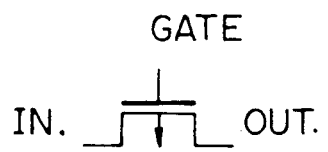
FIG. 13 is an explanatory diagram of a second object transistor (PMOS)

FIG. 13 illustrates a second example, which is a PMOS transistor.

Inversely to the example of FIG. 12, the transistor is brought to ON state when the logic value of the gate signal is "0", and the transistor is brought to OFF state when the logic value thereof is "1".

Figure 14:
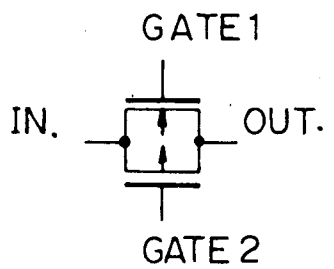
FIG. 14 is an explanatory diagram of a third object transistor (CMOS)
Figure 15A:
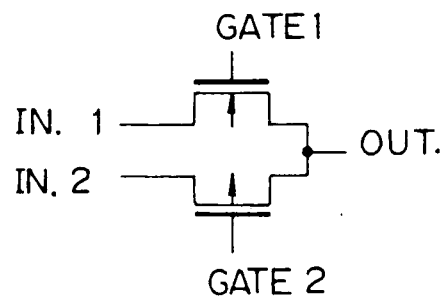
FIGS. 15A to 15D are explanatory diagrams of various modifications of the third object transistor (CMOS)
Figure 15B:
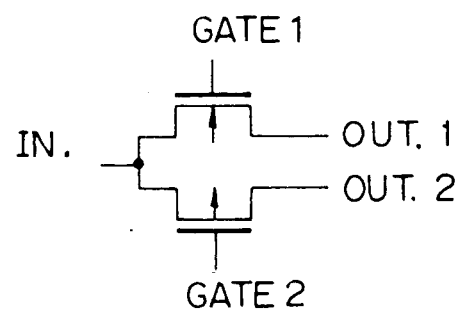
Figure 15C:
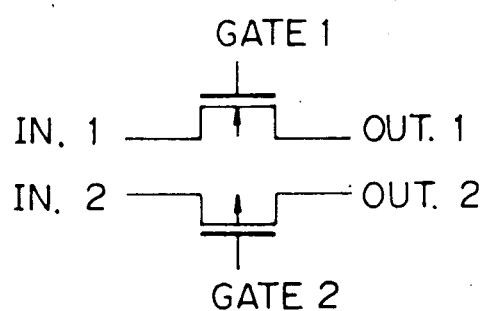
Figure 15D:
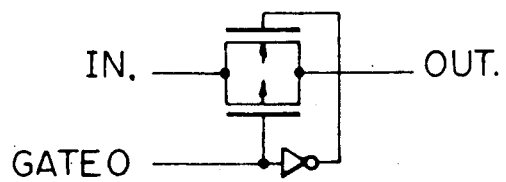

FIG. 14 illustrates a third example, which are complementary MOS (CMOS) transistors.

The CMOS transistors are brought to ON state when the logic value at the gate 1 is "1" and the logic value at the gate 2 is "0", while the CMOS transistors are brought to OFF state when the logic value at the gate 1 is "0" and the logic value at the gate 2 is "1".

Various modifications of the third example (CMOS) are shown in FIGS. 15A to 15D.

Next, the preferred embodiment will be explained with reference to FIGS. 16A,16B to 21.

((Concrete example))

Figure 16A:
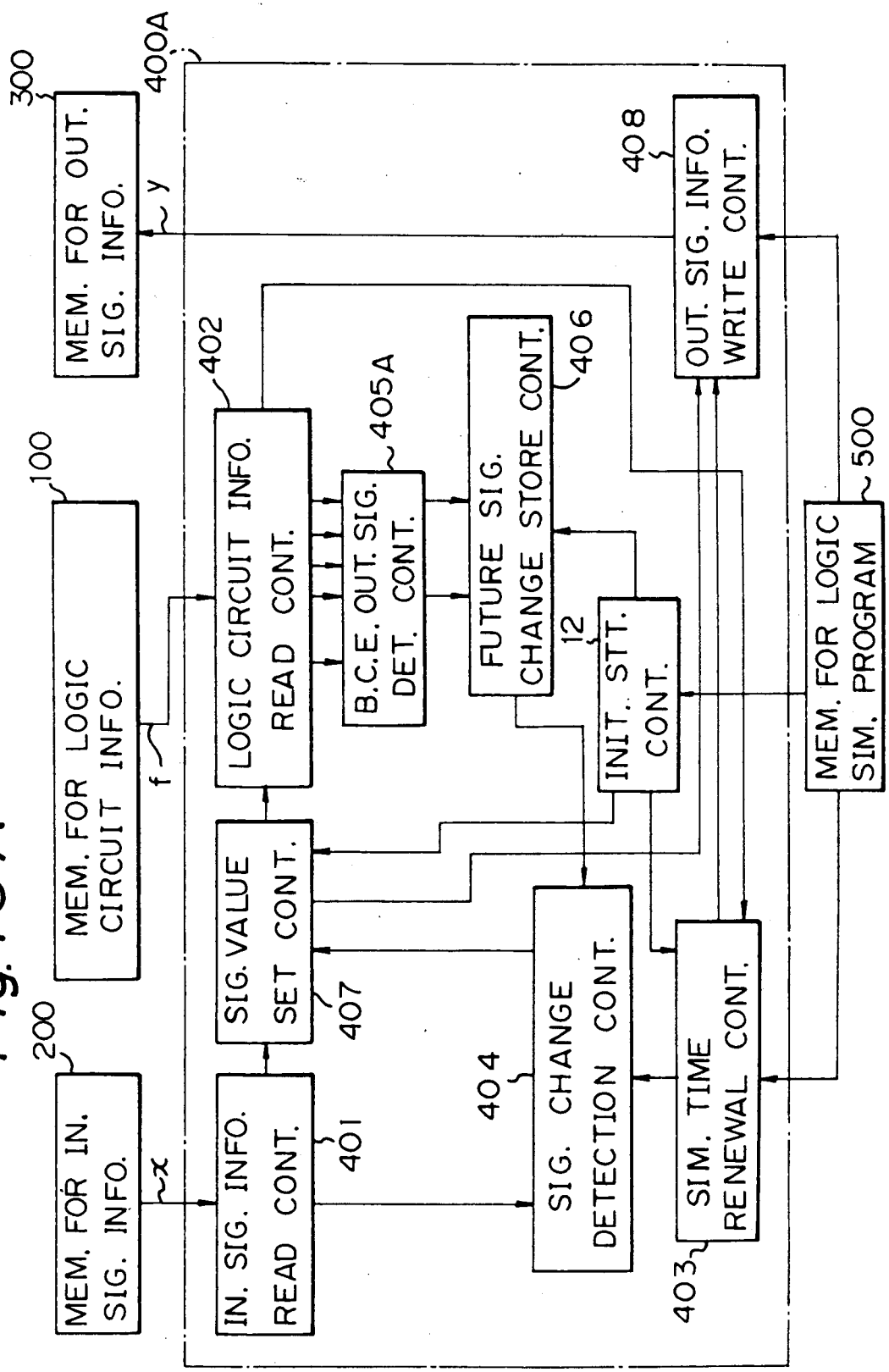

FIGS. 16A and 16B illustrate a constitution of the logic circuit simulator as an embodiment of the present invention. Note, since the same references as those employed in FIG. 1 (prior art) indicate like constituent elements, the explanation thereof is omitted.

The constitution of the present embodiment is different from that of FIG. 1 in that, in place of the control unit 405, a control unit 405A for determining the output signal of a basic circuit element is provided, and that a control unit 12 for starting a initialization of a simulation execution controller 400A is added to the simulator.

Referring to FIG. 16B, the control unit 405A is constituted by: a unit 1 for discriminating the kind of a circuit element (an object to be simulated) contained in the logic circuit information (f) fed from the control unit 402; a unit 2 for detecting the presence or absence of a dot gate at the input side of an object transistor based on the logic circuit information (f) fed from the control unit 402; a unit 3 for reading a transistor signal value from the control unit 402 based on the result of the discrimination unit 1 (where the circuit element is a transistor); a unit 4 for reading a signal value from the control unit 402 based on the result of the discrimination unit 1 (where the circuit element is not a transistor); a unit 5 for reading a signal delay value of the output side of the transistor from the control unit 402; a unit 6 for reading a signal delay value of the input side of the dot gate detected by the detection unit 2; a unit 7 for detecting an input signal having a maximum signal delay value among a plurality of input signals at the input side of the dot gate; a unit 8 for comparing a transistor input side maximum delay value ($td_1$) fed from the detection unit 7 with a transistor output side delay value ($td_2$) fed from the unit 5; a unit 9 for storing the result of the comparison by the unit 8; and units 10 and 11 for determining an output signal value based on the signal value read by the units 3 and 4, respectively.

Figure 17:
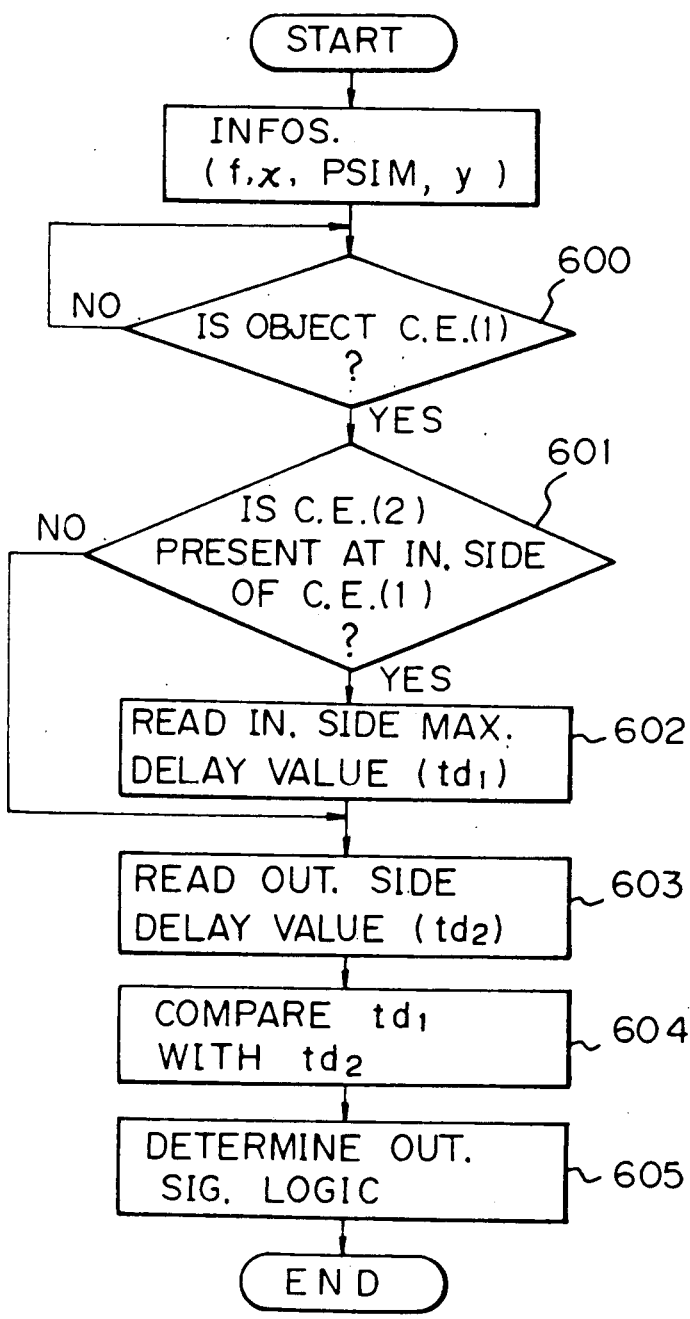
FIG. 17 is a flow chart representing a fundamental operation of the logic circuit simulator shown in FIGS. 16A and 16B.
Figure 18:
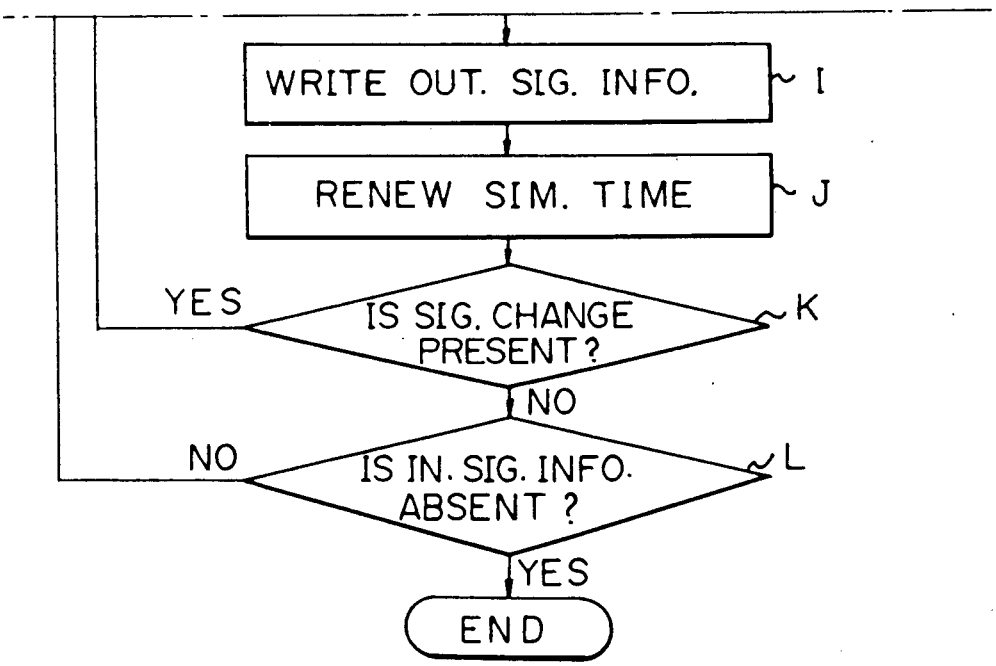
FIGS. 18A and 18B are flow charts concretely representing an entire operation of the logic circuit simulator shown in FIGS. 16A and 16B.

FIG. 17 illustrates a flow chart of the fundamental operation of the logic circuit simulator shown in FIGS. 16A and 16B;

Prior to the execution of the logic simulation, the logic circuit information (f), the input signal information (x), the logic simulation program (PSIM) and the output signal information (y) are produced in advance, and stored in the memories 100, 200, 500 and 300, respectively.

First, at step 600, the control judges whether the object circuit element to be simulated is a first circuit element, e.g. transistor, (YES) or not (NO), and proceeds to step 601 if the result is YES. If the result is NO, the control repeats the processing of step 600.

At step 601, the control judges whether a second circuit element (e.g. dot gate) is present at the input side of the first circuit element (YES) or not (NO), and proceed to step 602 if the result is YES. If the result is NO, the control jumps to step 603.

At step 602, the control reads the maximum delay time ($td_1$) of the input side circuit(s) of the second circuit element. Then, at step 603, the control reads the delay time ($td_2$) of the output side circuit(s) of the first circuit element. At step 604, the control compares the input side maximum delay time ($td_1$) with the output side delay time ($td_2$).

Finally, at step 605, the control determines the movement direction of the signal in the first circuit element based on the result of the comparison at step 604, and determines the logic value of the output signal of the object circuit element according to the predetermined definitions.

Next, the concrete simulation operation will be explained with reference to FIGS. 18A to 21.

Figures 19, 19A, 19B:
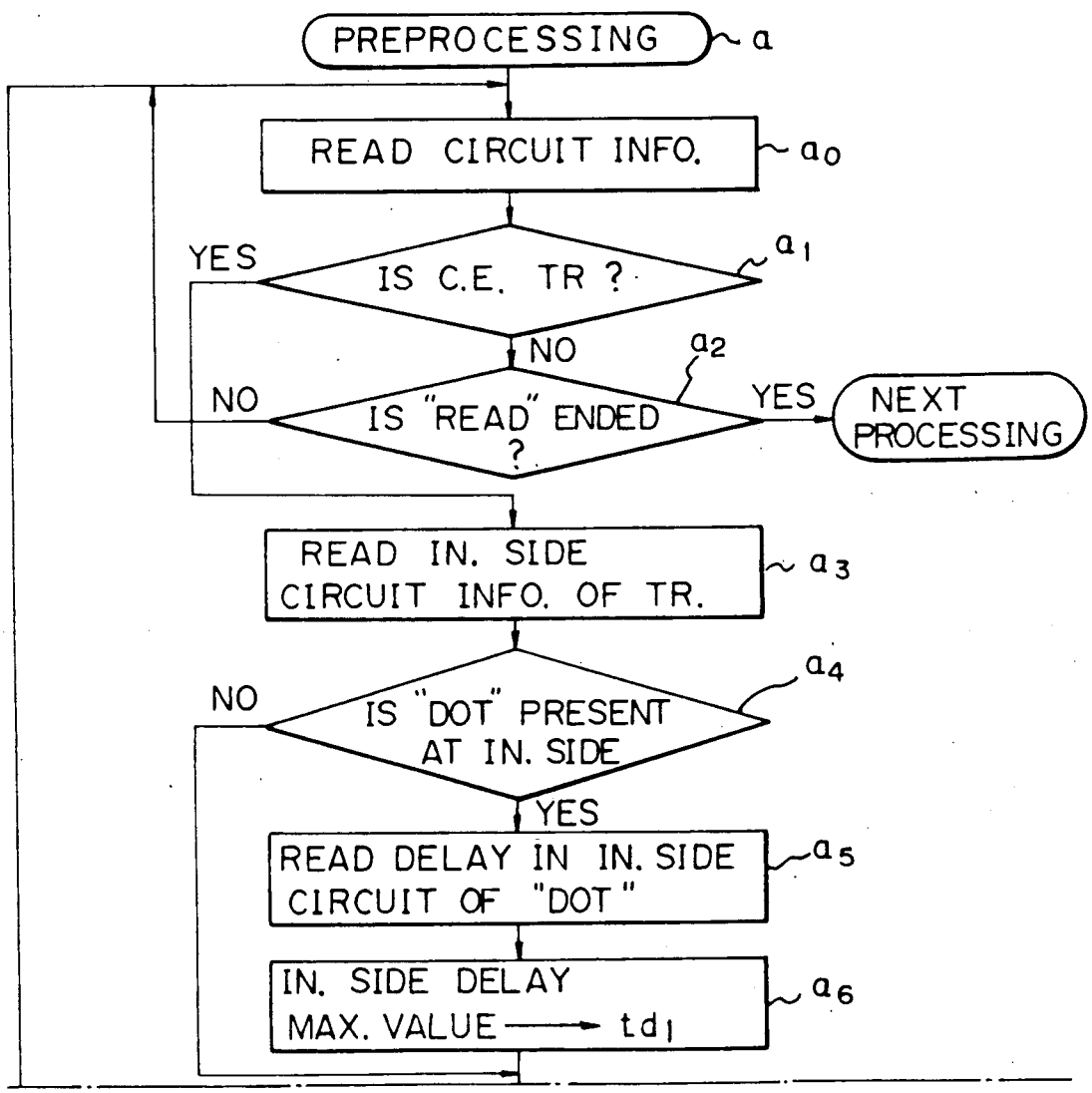
FIGS. 19A and 19B are flow charts representing a content of the preprocessing (a) in FIG. 18A.
Figure 19:
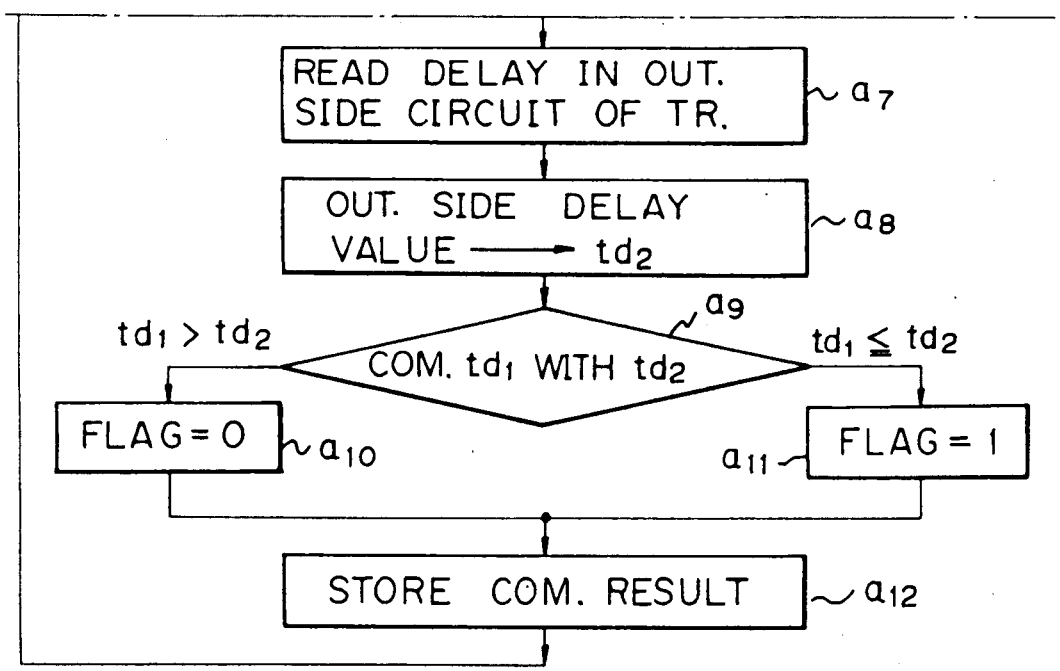

FIGS. 18A and 18B illustrate flow charts of the entire operation; FIGS. 19A and 19B illustrate flow charts of the preprocessing (a) in FIG. 18A; and FIGS. 20A to 21 illustrate flow charts of the processing (d) of determining output signal values in FIG. 18A.

At steps (B),(A) and (b), when the logic circuit simulator is started (powered ON), the initialization starting control unit 12 initializes the simulation time renewal control unit 403, the signal value setting control unit 407 and the future signal change storing control unit 406 according to the logic simulation program from the memory 500.

In the process, where the kind of the circuit element is discriminated to be a transistor, the preprocessing (a) is carried out as described below. Since the preprocessing (a) is sufficient with one-time execution, it is preferable from a viewpoint of the efficiency in processing to complete the preprocessing for all of the transistors at the starting of initialization. Of course, although not shown, whenever the kind of the circuit element is discriminated to be a transistor, the preprocessing may be carried out for the transistor concerned.

Referring to FIG. 19, the preprocessing (a) is carried out as follows:

At step (a0), the control reads the logic circuit information (f). At step (a1), the control judges whether the circuit element is a transistor (YES) or not (NO) based on the read logic circuit information, and proceeds to step (a2) if the result is NO. If the result is YES, the control jumps to step (a3). At step (a2), the control judges whether the logic circuit information is gone (YES) or not (NO), and proceeds to the next processing, i.e., processing (B) of FIG. 18, if the result is YES. If the result is NO, the control returns to step (a0), and repeats the processings of steps (a0) to (a2).

At step (a3), the control reads the circuit information of the input side of the transistor. At step (a4), the control (see FIG. 16B, unit 2) judges whether the dot gate is present (YES) at the input side of the transistor or not (NO), and proceeds to step (a5) if the result is YES. If the result is NO, the control jumps to step (a7).

At step (a5), the control (see FIG. 16B, unit 6) reads all of the signal delay values of the input side of the dot gate. At step (a6), the control (see FIG. 16B, detection unit 7) detects the maximum delay value ($td_1$) among the read signal delay values.

At step (a7), the control (see FIG. 16B, unit 5) reads the signal delay value of the output side of the transistor and, at step (a8), the control verifies the output side delay value ($td_2$).

At step (a9), the control (see FIG. 16B, unit 8) compares the input side maximum delay value ($td_1$) with the output side delay value ($td_2$). If the result is $$td_1 > td_2,$$

the control proceeds to step (a10) to make FLAG "0". If the result at step (a9) is $$td_1 \leq td_2,$$

the control proceeds to step (a11) to make FLAG "1".

At step (a12), the control (see FIG. 16B, unit 9) stores the result of the comparison by the unit 8 in the form of the FLAG. The above explained steps (a0) to (a12) are repeatedly carried out for all of the transistors and, when the circuit information of the transistors is gone, the preprocessing (a) is ended.

Referring to FIG. 18A, after the preprocessing (a) and the processing of initialization (B),(A),(b) are completed, the control proceeds to step (C). At step (C), the control (see FIG. 16A, control unit 401) reads the input signal name and signal value at current time from the input signal information memory 200 and, at step (D), sets the information to the control unit 407 (see FIG. 16A).

At step (c), the control (see FIG. 16A, control unit 402) reads the logic circuit information (f) from the input signal name with units of the circuit employing the input signal, and outputs the information to the basic circuit element output signal determination control unit 405A (see FIGS. 16A and 16B).

When the logic circuit information (f) corresponding to the input signal name is input to the control unit 405A, the discrimination unit 1 discriminates whether the circuit element is a transistor or not.

The processing of the case that the circuit element is not a transistor is the same as the prior art (see FIGS. 4A and 4B, and the description concerned). Namely, the control reads the value of the signal forming the input of the circuit element concerned, and determines the output signal value and the future signal change time based on "the current time plus the output signal delay value" according to the kind of the circuit element.

On the other hand, the processing of the case that the circuit element is a transistor is completed by the preprocessing at step (a). Namely, since the result (FLAG) based on the comparison of the delay values $td_1, td_2$ is stored in the unit 9 (see FIG. 16B), the control uses the FLAG to determine the output signal value of the transistor.

Figure 20B:
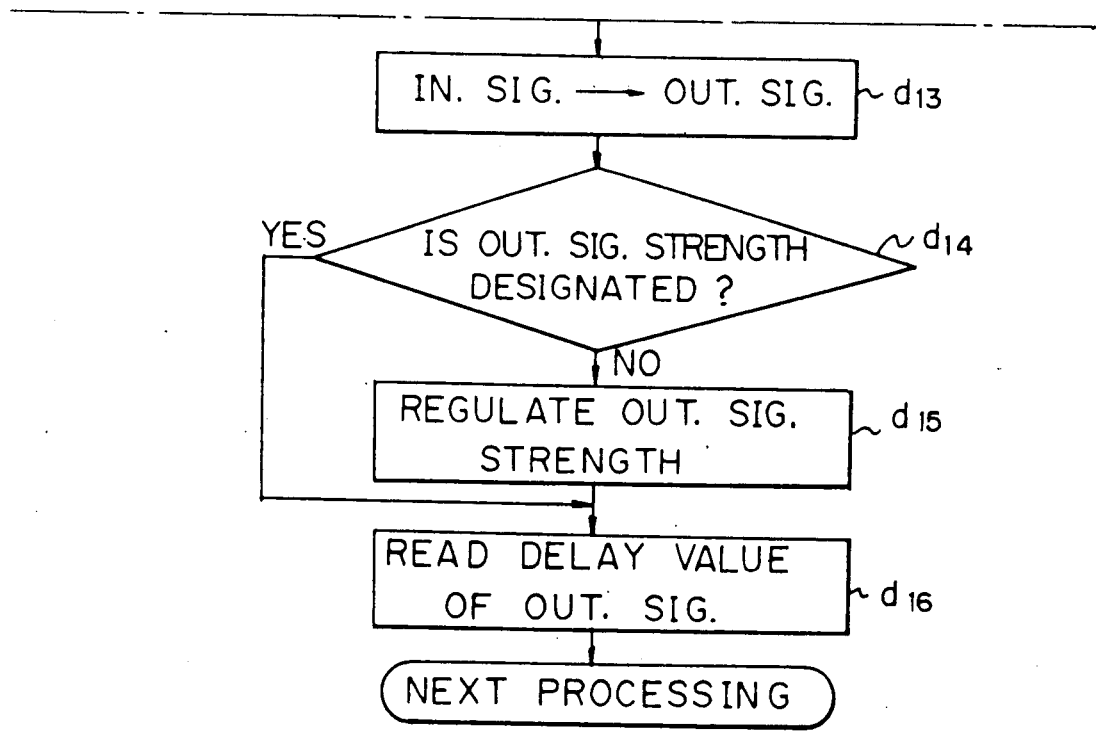
Figure 21:
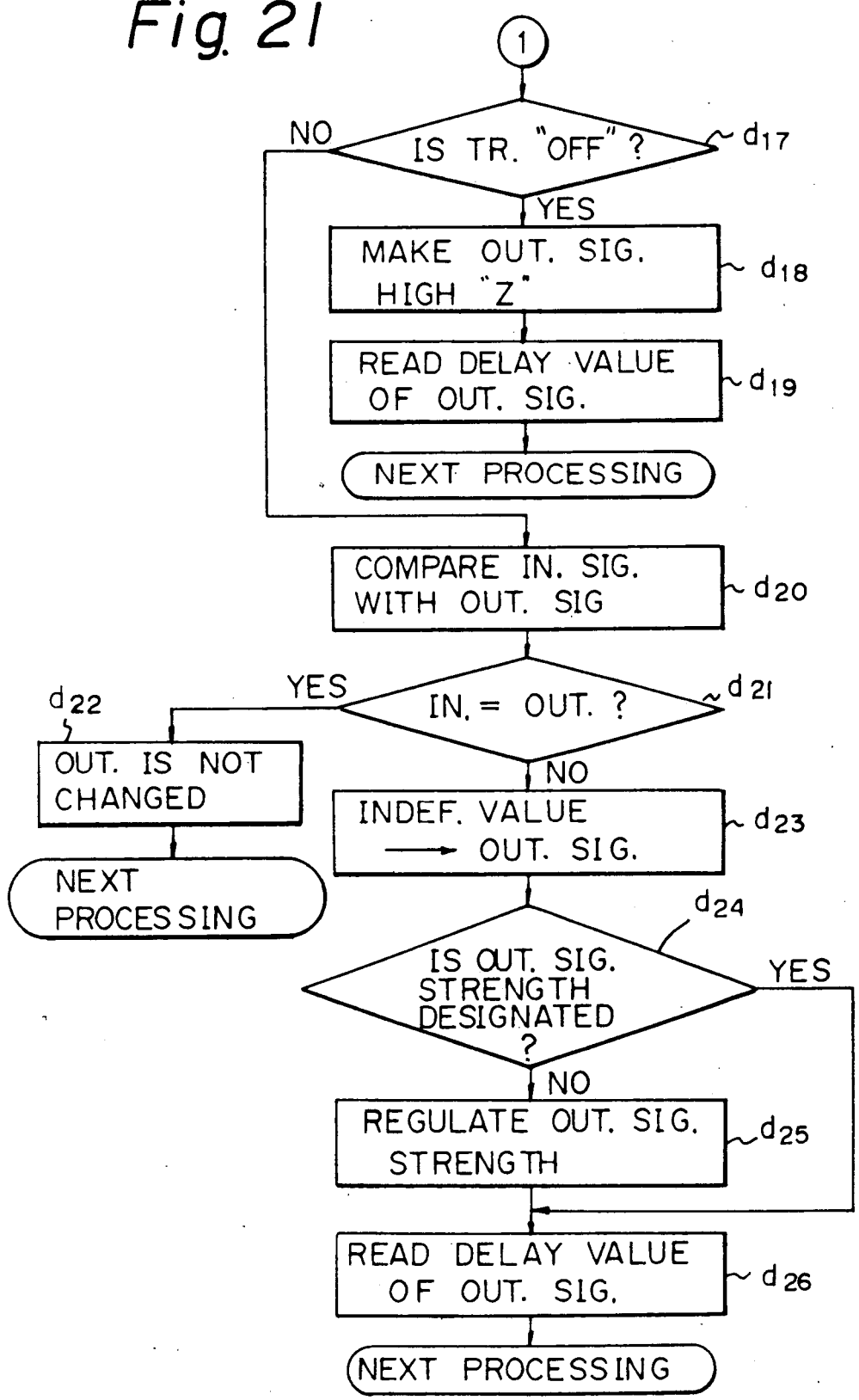
FIG. 21 is a flow chart representing the remaining part of the processing (d).

FIGS. 20A, 20B and 21 illustrate flow charts of the processing (d) of determining output signal values in FIG. 18A. The former shows the case that the transistor is "ON" state and the latter shows the case that the transistor is "OFF" state.

First, the control (see FIG. 16B, unit 3) reads the signal values of the terminals of the transistor (steps (d1),(d2) and (d5)). Next, the control (see FIG. 16B, unit 10) determines the output signal values of the transistor according to the definition described in ((Summary)).

Now, assuming that the transistor is "ON" state (step (d6),YES). Where both the input signal strength and the output signal strength are high impedance "Z" (steps (d7) and (d8),YES), the control uses the result of the comparison of $td_1$ and $td_2$ (FLAG) to determine the output signal value of the transistor (step (d9)). For example, where $td_1 > td_2$, the output signal value is substituted by the input signal value. Namely, the output signal is changed (step (d10)). Inversely, where $td_1 \leq td_2$, the output signal is not changed (step (d11)).

Where the input signal strength or the output signal strength is not high impedance "Z" (step (d8), NO), the signal value corresponding to the input signal strength restricted by the output signal strength of the transistor is defined as the output signal (steps (d13) to (d16)).

On the other hand, where the transistor is "OFF" state (step (d6),NO, and FIG. 21), the output signal strength of the transistor is made high impedance "Z" (steps (d17),YES, (d18) and (d19)).

Where the logic value of the gate signal of the transistor is an indefinite value (or error value), the input signal value is compared with the output signal value (step (d20)). If the input signal value and the output signal value are equal, the output signal is not changed (steps (d21),YES and (d22). If not, however, a signal having the logic value "X" or "E" corresponding to the input signal strength restricted by the output signal strength of the transistor is defined as the output signal (steps (d21), NO and (d23) to (d26)).

Referring to FIGS. 18A and 18B, after the processing (d) of determining output signal values, the control (see FIG. 16A, control unit 406) stores information of the future change of the output signal, i.e., the future signal change time, future signal value and signal name, in the control unit 404 (step (G)).

At step (H), the control (see FIG. 16A, control unit 402) judges whether the reading of the logic circuit information (f) is completed (YES) or not (NO), i.e., whether the signal link is absent or not, and proceeds to step (I) if the result is YES. If the result is NO, the control returns to step (c), and repeats the processings of steps (c) to (G). At step (I), the control (see FIG. 16A, control unit 408) writes the signal value of the logic circuit information (f) at the current simulation time into the memory 300. At step (J), the control (unit 403) renews the current simulation time and outputs the renewed simulation time to the control unit 404.

At step (K), the control (control unit 404) judges whether a future signal change and a signal change due to the input signal are present at the new simulation time (YES) or not (NO), and proceeds to step (L) if the result is NO. If the result is YES, the control returns to step (D) to repeat the processings of steps (D) to (J). Finally, at step (L), the control judges whether the input signal information is absent (YES) or not (NO), and proceeds to an END if the result is YES. If the result is NO, the control returns to step (C), and repeats the processings of steps (C) to (K) until the input signal information is gone.

The present embodiment explained above has the following advantages:

The prior art logic simulation has been carried out according to only the information as to whether the gate signal value of an object transistor is active or inactive. Namely, since the definition concerning the operation of the transistor is not sufficient or perfect, it is impossible to carry out a perfect simulation on the transistor level subordinate to the gate level.

Contrary to this, according to the present embodiment, since the simulation is carried out by determining the input side maximum delay value ($td_1$) and the output side delay value ($td_2$) with respect to a certain object transistor, comparing the delay values $td_1$, $td_2$ and determining the logic value of the output signal based on the result of the comparison, it is possible to effect a perfect simulation on the transistor level without using a large-scale computer such as a switch level simulation apparatus. In other words, it is possible to carry out the logic simulation of the transistor operation by means of a relatively small-scale, general-purpose and low-cost machine such as a personal computer, work station, or the like.

Also, since the machine used for the simulation is relatively low-cost, a large quantity of uses thereof enables a reduction in the number of processes in the logic design. Furthermore, since a large-scale computer such as the switch level simulation apparatus need not be used, the algorithm of the simulation program can be simplified to ensure high-speed processing.

Although, in the above-described embodiment, the simulation is carried out by software processing by means of the computer based on the simulation program, the simulation approach may be embodied by a farmware or hardware having the like functions.

Also, although the above-described embodiment has been explained by way of the signal delay values $td_1$, $td_2$, basically, the capacitance values can be substituted for the delay values. In this case, the signal delay values $td_1$, $td_2$ are expressed by the equivalent capacitance values C1,C2 (see FIGS. 11A,11B) at the input side and output side of the object transistor, respectively. Note, where the dot gate DT is present at the input side of the object transistor as shown in FIG. 10, the capacitance value C1 corresponding to the delay value $td_1$ is expressed by the total of a capacitance at the output side of the circuits (inverters) at the input side of the dot gate, a capacitance at the input side thereof and a wiring capacitance in the connection.

Although the present invention has been disclosed and described by way of one embodiment, it is apparent to those skilled in the art that other embodiments and modifications of the present invention are possible without departing from the spirit or essential features thereof.

We claim:

1. An apparatus for effecting a simulation of a logic circuit, said apparatus comprising:

means for storing logic circuit information concerning said logic circuit, input signal information concerning each of circuit elements constituting said logic circuit, simulation control information and output signal information; and a controller for executing a logic circuit simulation based on said logic circuit information and said input signal information according to said simulation control information and producing said output signal information, said controller determining an input side signal delay value and an output side signal delay value with respect to a circuit element which is a simulation object, comparing the determined delay values and, based on a result of said comparing, determining an output signal value of the simulation object circuit element to form said output signal information.

2. An apparatus as set forth in claim 1, wherein said controller comprises:

a first discriminating means for discriminating whether or not said simulation object circuit element is a circuit element of first kind;

a second discriminating means for discriminating whether or not a circuit element of second kind is present at an input side of said circuit element of first kind where said simulation object circuit element is the circuit element of first kind;

a first delay value reading means for reading an input side signal delay value of said circuit element of first kind based on an output of said second discriminating means;

a third discriminating means for discriminating whether or not a circuit element of second kind is present at an output side of said circuit element of first kind where said simulation object circuit element is the circuit element of first kind;

a second delay value reading means for reading an output side signal delay value of said circuit element of first kind based on an output of said third discriminating means;

a comparing means for comparing said input side signal delay value with said output side signal delay value; and an output signal value determining means for determining an output signal value of said simulation object circuit element based on an output of said comparing means in accordance with predetermined definitions.

3. An apparatus as set forth in claim 2, wherein said first delay value reading means reads a maximum delay value among each delay value of a plurality of input signals of said circuit element of second kind where the circuit element of second kind is present at the input side of said circuit element of first kind, and reads an input side signal delay value of said circuit element of first kind where said circuit element of second kind is absent at the input side of the circuit element of first kind.

4. An apparatus as set forth in claim 3, wherein said input side signal delay value and said output side signal delay value are expressed by an equivalent capacitance value of a circuit element or circuit elements connected to the input side and the output side of said simulation object circuit element, respectively.

5. An apparatus as set forth in claim 2, wherein said second delay value reading means reads a maximum delay value among each delay value of a plurality of input signals of said circuit element of second kind where the circuit element of second kind is present at the output side of said circuit element of first kind, and reads an output side signal delay value of said circuit element of first kind where said circuit element of second kind is absent at the output side of the circuit element of first kind.

6. An apparatus as set forth in claim 5, wherein said input side signal delay value and said output side signal delay value are expressed by an equivalent capacitance value of a circuit element or circuit elements connected to the input side and the output side of said simulation object circuit element, respectively.

7. An apparatus as set forth in claim 2, further comprising a signal direction storing means for storing information of a movement direction of a signal in said circuit element of first kind based on a result of said comparing means, and a signal value reading means for reading signal values of said circuit element of first kind, wherein said output signal value determining means determines an output signal value of the circuit element of first kind according to outputs of said signal direction storing means and said signal value reading means.

8. An apparatus as set forth in claim 7, wherein said circuit element of first kind is a transistor and said circuit element of second kind is a dot gate which is formed by short-circuiting each output end of a plurality of logic circuits by means of a wired-OR connection.

9. An apparatus as set forth in claim 8, wherein each signal value used in the logic circuit simulation is defined by a combination of one of a plurality of signal strengths and one of a plurality of logic values and, when a gate signal value of said transistor has a first logic value which brings the transistor to an active state and input/output signal values thereof have a first signal strength, respectively, which is the weakest among said plurality of signal strengths, said output signal value determining means substitutes the output signal value of the transistor by the input signal value thereof where a content of said signal direction storing means indicates that said input side signal delay value is more than said output side signal delay value.

10. An apparatus as set forth in claim 9, wherein said output signal value determining means makes the output signal value of the transistor unchanged where a content of said signal direction storing means indicates that said input side signal delay value is equal to or less than said output side signal delay value.

11. An apparatus as set forth in claim 10, wherein said input side signal delay value and said output side signal delay value are expressed by an equivalent capacitance value of a circuit element or circuit elements connected to the input side and the output side of said simulation object circuit element, respectively.

12. An apparatus as set forth in claim 9, wherein said input side signal delay value and said output side signal delay value are expressed by an equivalent capacitance value of a circuit element or circuit elements connected to the input side and the output side of said simulation object circuit element, respectively.

13. An apparatus as set forth in claim 9, wherein, when a gate signal value of said transistor has said first logic value and at least one of the input/output signal values thereof has a signal strength other than said first signal strength, said output signal value determining means substitutes the output signal value of the transistor by the input signal value thereof corresponding to a signal strength restricted by a designated output signal strength.

14. An apparatus as set forth in claim 13, wherein, when a gate signal value of said transistor has a second logic value which brings the transistor to an inactive state, said output signal value determining means maintains the output signal value of the transistor to said first signal strength.

15. An apparatus as set forth in claim 14, wherein said input side signal delay value and said output side signal delay value are expressed by an equivalent capacitance value of a circuit element or circuit elements connected to the input side and the output side of said simulation object circuit element, respectively.

16. An apparatus as set forth in claim 13, wherein, when a gate signal value of said transistor has a third logic value which brings an operation of the transistor to an indefinite state, said output signal value determining means makes the output signal value of the transistor unchanged where the input signal value is equal to the output signal value.

17. An apparatus as set forth in claim 16, wherein said input side signal delay value and said output side signal delay value are expressed by an equivalent capacitance value of a circuit element or circuit elements connected to the input side and the output side of said simulation object circuit element, respectively.

18. An apparatus as set forth in claim 13, wherein said input side signal delay value and said output side signal delay value are expressed by an equivalent capacitance value of a circuit element or circuit elements connected to the input side and the output side of said simulation object circuit element, respectively.

19. An apparatus as set forth in claim 9, wherein, when all of input signals of said dot gate first signal strength, said output signal value determining means maintains the output signal value of said transistor to the first signal strength.

20. An apparatus as set forth in claim 19, wherein said input side signal delay value and said output side signal delay value are expressed by an equivalent capacitance value of a circuit element or circuit elements connected to the input side and the output side of said simulation object circuit element, respectively.

21. An apparatus as set forth in claim 8, wherein said input side signal delay value and said output side signal delay value are expressed by an equivalent capacitance value of a circuit element or circuit elements connected to the input side and the output side of said simulation object circuit element, respectively.

22. An apparatus as set forth in claim 7, wherein said input side signal delay value and said output side signal delay value are expressed by an equivalent capacitance value of a circuit element or circuit elements connected to the input side and the output side of said simulation object circuit element, respectively.

23. An apparatus as set forth in claim 2, wherein said input side signal delay value and said output side signal delay value are expressed by an equivalent capacitance value of a circuit element or circuit elements connected to the input side and the output side of said simulation object circuit element, respectively.

24. An apparatus as set forth in claim 1, wherein said input side signal delay value and said output side signal delay value are expressed by an equivalent capacitance value of a circuit element or circuit elements connected to the input side and the output side of said simulation object circuit element, respectively.

25. An apparatus for effecting a simulation of a logic circuit, said apparatus comprising:
   means for storing logic circuit information concerning said logic circuit, input signal information concerning each of circuit elements constituting said logic circuit, simulation control information and output signal information; and
   a controller for executing a logic circuit simulation based on said logic circuit information and said input signal information according to said simulation control information and producing said output signal information, said controller including:
   a first discriminating means for discriminating whether or not a simulation object circuit element is a circuit element of first kind;
   a second discriminating means for discriminating whether or not a circuit element of second kind is present at an input side of said circuit element of first kind where said simulation object circuit element is the circuit element of first kind;
   a first capacitance value reading means for reading a total equivalent capacitance value at the input side of said circuit element of first kind based on an output of said second discriminating means;
   a third discriminating means for discriminating whether or not a circuit element of second kind is present at an output side of said circuit element of first kind where said simulation object circuit element is the circuit element of first kind;
   a second capacitance value reading means for reading a total equivalent capacitance value at the output side of said circuit element of first kind based on an output of said third discriminating means;
   a comparing means for comparing the input side total equivalent capacitance value with the output side total equivalent capacitance value; and
   an output signal value determining means for determining an output signal value of said simulation object circuit element based on an output of said comparing means in accordance with predetermined definitions.

26. An apparatus as set forth in claim 25, wherein said output signal value determining means substitutes an output signal value of said simulation object circuit element by an input signal value thereof when said input side total equivalent capacitance value is more than said output side total equivalent capacitance value, and makes the output signal value of the simulation object circuit element unchanged when the input side total equivalent capacitance value is equal to or less than the output side total equivalent capacitance value.

27. A method for producing a semiconductor device using a logic simulation approach, said method comprising the steps of:

determining an input side signal delay value and an output side signal delay value with respect to each of circuit elements constituting a designed logic circuit which is a simulation object;

comparing the determined input side signal delay value with the determined output side signal delay value;

determining an output signal value of the simulation object circuit element based on a result of said comparing and then verifying a function of said designed logic circuit; and effecting a patterning of the designed logic circuit on a semiconductor wafer to produce a semiconductor device.

28. A method as set forth in claim 27, further comprising a step of discriminating whether or not said simulation object circuit element is a circuit element of first kind and a step of discriminating whether or not a circuit element of second kind is present at an input side of the circuit element of first kind where the simulation object circuit element is the circuit element of first kind, prior to the step of determining an input side signal delay value and an output side signal delay value.

29. A method as set forth in claim 28, further comprising a step of storing information of a movement direction of a signal in said circuit element of first kind based on a result of said comparing and a step of reading signal values of said circuit element of first kind, prior to the step of determining an output signal value of the simulation object circuit element.

30. A method as set forth in claim 29, where the step of determining an input side signal delay value includes a step of reading a maximum delay value among each delay value of a plurality of input signals of said circuit element of second kind where the circuit element of second kind is present at the input side of said circuit element of first kind, and a step of reading an input side signal delay value of said circuit element of first kind where said circuit element of second kind is absent at the input side of the circuit element of first kind.

31. A method as set forth in claim 29, where the step of determining an output side signal delay value includes a step of reading a maximum delay value among each delay value of a plurality of input signals of said circuit element of second kind where the circuit element of second kind is present at the output side of said circuit element of first kind, and a step of reading an output side signal delay value of said circuit element of first kind where said circuit element of second kind is absent at the output side of the circuit element of first kind.

* * * * *

UNITED STATES PATENT AND TRADEMARK OFFICE
CERTIFICATE OF CORRECTION

PATENT NO. : 5,051,911

DATED : September 24, 1991

INVENTOR(S) : Masaharu KIMURA et al.

It is certified that error appears in the above-identified patent and that said Letters Patent is hereby corrected as shown below:

Col. 5,    line 55,    after "operation of" insert --an--.

Col. 6,    line 31,    change "another" to --other--.

Col. 9,    line 16,    before "Determination" insert --②--;
           line 25,    before "As" insert --③--;
           line 38,    change "an" to --a--;
           line 46,    before "The" insert --④--;
           line 50,    before "Whether" insert --⑤--.

Col. 10,   line 8,     before "Note," insert --①--;
           line 12,    before "Whether" insert --②--, and after "described in" insert --①--;
           line 67,    change "starting a" to --starting an--.

Col. 11,  line 44,    change "proceed" to --proceeds--.

Col. 13,  line 62,    change "(d22)" to --(d22))--.

Col. 17,  line 56,    after "gate" insert --have said--.

Signed and Sealed this

Twenty-sixth Day of October, 1993

Attest:

BRUCE LEHMAN

Attesting Officer           Commissioner of Patents and Trademarks